(12) United States Patent
Crafts et al.

(10) Patent No.: US 8,638,113 B2
(45) Date of Patent: Jan. 28, 2014

(54) TEMPORARY PLANAR ELECTRICAL CONTACT DEVICE AND METHOD USING VERTICALLY-COMPRESSIBLE NANOTUBE CONTACT STRUCTURES

(75) Inventors: Douglas E. Crafts, Los Gatos, CA (US); Jyoti K. Bhardwaj, Cupertino, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/773,117

(22) Filed: May 4, 2010

(65) Prior Publication Data

US 2011/0018566 A1    Jan. 27, 2011

Related U.S. Application Data

(60) Continuation of application No. 12/211,354, filed on Sep. 16, 2008, now Pat. No. 7,710,106, which is a division of application No. 11/426,249, filed on Jun. 23, 2006, now Pat. No. 7,439,731.

(60) Provisional application No. 60/694,049, filed on Jun. 24, 2005, provisional application No. 60/757,444, filed on Jan. 9, 2006, provisional application No. 60/778,205, filed on Mar. 2, 2006.

(51) Int. Cl.
  *G01R 31/20*    (2006.01)
(52) U.S. Cl.
  USPC ............ 324/754.03; 324/754.07; 324/500
(58) Field of Classification Search
  None
  See application file for complete search history.

(56) References Cited

U.S. PATENT DOCUMENTS

| | | |
|---|---|---|
| 5,366,380 A | 11/1994 | Reymond |
| 5,741,144 A | 4/1998 | Elco et al. |
| 5,829,128 A | 11/1998 | Eldridge et al. |
| 5,903,161 A | 5/1999 | Amemiya et al. |
| 6,020,747 A | 2/2000 | Bahns et al. |

(Continued)

FOREIGN PATENT DOCUMENTS

| | | |
|---|---|---|
| EP | 1830367 | 9/2007 |
| EP | 1845124 | 10/2007 |

(Continued)

OTHER PUBLICATIONS

Andrews et al., "Continuous production of aligned carbon nanotubes: a step closer to commercial realization," Chemical Physics Letters 303 (Apr. 16, 1999), pp. 467-474.

(Continued)

*Primary Examiner* — Jermele M Hollington
*Assistant Examiner* — Trung Nguyen
(74) *Attorney, Agent, or Firm* — Kirton McConkie

(57) ABSTRACT

A wafer-scale probe card for temporary electrical contact to a sample wafer or other device, for burn-in and test. The card includes a plurality of directly metallized single-walled or multi-walled nanotubes contacting a pre-arranged electrical contact pattern on the probe card substrate. The nanotubes are arranged into bundles for forming electrical contacts between areas of the device under test and the probe card. The bundles are compressible along their length to allow a compressive force to be used for contacting the probe card substrate to the device under test. A strengthening material may be disposed around and/or infiltrate the bundles. The nanotubes forming the bundles may be patterned to provide a pre-determined bundle profile. Tips of the bundles may be metallized with a conductive material to form a conformal coating on the bundles; or metallized with a conductive material to form a continuous, single contact surface.

23 Claims, 22 Drawing Sheets

(56) References Cited

U.S. PATENT DOCUMENTS

| | | | |
|---|---|---|---|
| 6,031,711 A | 2/2000 | Tennent et al. | |
| 6,184,053 B1 | 2/2001 | Eldridge et al. | |
| 6,232,706 B1 | 5/2001 | Dai et al. | |
| 6,346,189 B1 | 2/2002 | Dai et al. | |
| 6,379,982 B1 | 4/2002 | Ahn et al. | |
| 6,401,526 B1 | 6/2002 | Dai et al. | |
| 6,457,350 B1 | 10/2002 | Mitchell | |
| 6,597,090 B1 | 7/2003 | Mancevski | |
| 6,626,684 B1 | 9/2003 | Stickler et al. | |
| 6,636,050 B2 | 10/2003 | Nakayama et al. | |
| 6,653,208 B2 | 11/2003 | Ahn et al. | |
| 6,709,566 B2 | 3/2004 | Cumings et al. | |
| 6,790,684 B2 | 9/2004 | Ahn et al. | |
| 6,791,171 B2 | 9/2004 | Mok et al. | |
| 6,800,865 B2 | 10/2004 | Nakayama et al. | |
| 6,815,961 B2 | 11/2004 | Mok et al. | |
| 6,863,942 B2 | 3/2005 | Ren et al. | |
| 6,869,671 B1 | 3/2005 | Crouse et al. | |
| 6,870,361 B2 | 3/2005 | Chopra et al. | |
| 6,890,506 B1 | 5/2005 | Harutyunyan et al. | |
| 6,900,479 B2 | 5/2005 | DeHon et al. | |
| 6,933,222 B2 | 8/2005 | Dubin et al. | |
| 6,945,827 B2 | 9/2005 | Grube et al. | |
| 6,967,013 B2 | 11/2005 | Someya et al. | |
| 6,979,244 B2 | 12/2005 | Den et al. | |
| 7,012,441 B2 | 3/2006 | Chou et al. | |
| 7,057,402 B2 | 6/2006 | Cole et al. | |
| 7,082,683 B2 | 8/2006 | Han et al. | |
| 7,094,123 B2 | 8/2006 | Oyama et al. | |
| 7,132,039 B2 | 11/2006 | Anasawa et al. | |
| 7,147,966 B2 | 12/2006 | Ren et al. | |
| 7,160,531 B1 | 1/2007 | Jacques et al. | |
| 7,189,430 B2 | 3/2007 | Ajayan et al. | |
| 7,226,663 B2 | 6/2007 | Jiao et al. | |
| 7,242,012 B2 | 7/2007 | Leedy | |
| 7,250,188 B2 | 7/2007 | Dodelet et al. | |
| 7,251,884 B2 | 8/2007 | Grube et al. | |
| 7,258,901 B1 | 8/2007 | Lee et al. | |
| 7,349,223 B2 | 3/2008 | Haemer et al. | |
| 7,378,328 B2 | 5/2008 | Choi et al. | |
| 7,400,159 B2 | 7/2008 | Wang et al. | |
| 7,439,731 B2 | 10/2008 | Crafts et al. | |
| 7,585,548 B2 | 9/2009 | Wang et al. | |
| 7,671,397 B2 * | 3/2010 | Fujita et al. | 257/315 |
| 7,687,981 B2 * | 3/2010 | Parsapour | 313/311 |
| 7,710,106 B2 | 5/2010 | Crafts et al. | |
| 7,731,503 B2 | 6/2010 | Eldridge | |
| 7,777,291 B2 * | 8/2010 | Kabir | 257/471 |
| 8,130,007 B2 | 3/2012 | Eldridge et al. | |
| 8,149,007 B2 | 4/2012 | Chen et al. | |
| 2003/0010910 A1 | 1/2003 | Colbert et al. | |
| 2003/0153965 A1 | 8/2003 | Supronowicz et al. | |
| 2003/0165418 A1 | 9/2003 | Ajayan et al. | |
| 2003/0179559 A1 | 9/2003 | Engelhardt et al. | |
| 2003/0189235 A1 | 10/2003 | Watanabe et al. | |
| 2004/0036403 A1 | 2/2004 | Ouo et al. | |
| 2004/0106218 A1 | 6/2004 | Wang et al. | |
| 2004/0110003 A1 | 6/2004 | Cumings et al. | |
| 2004/0113621 A1 | 6/2004 | Naughton | |
| 2004/0173506 A1 | 9/2004 | Doktycz et al. | |
| 2004/0175850 A1 | 9/2004 | Shimizu et al. | |
| 2004/0208788 A1 | 10/2004 | Colton | |
| 2004/0211589 A1 | 10/2004 | Chou et al. | |
| 2005/0019245 A1 | 1/2005 | Koulikov | |
| 2005/0022376 A1 | 2/2005 | Alcoe | |
| 2005/0092464 A1 | 5/2005 | Leu et al. | |
| 2005/0285116 A1 | 12/2005 | Wang | |
| 2006/0028220 A1 | 2/2006 | Malantonio et al. | |
| 2006/0071334 A1 | 4/2006 | Kawabata et al. | |
| 2006/0073089 A1 | 4/2006 | Ajayan et al. | |
| 2006/0103406 A1 | 5/2006 | Kitazawa et al. | |
| 2006/0188721 A1 | 8/2006 | Irvin et al. | |
| 2006/0197547 A1 | 9/2006 | Chen | |
| 2006/0198956 A1 | 9/2006 | Eres | |
| 2006/0228897 A1 * | 10/2006 | Timans | 438/758 |
| 2006/0252853 A1 | 11/2006 | Ajayan et al. | |
| 2007/0004191 A1 | 1/2007 | Gu et al. | |
| 2007/0018098 A1 | 1/2007 | Nakayama et al. | |
| 2007/0051887 A1 | 3/2007 | Hidaka et al. | |
| 2007/0155158 A1 | 7/2007 | Gstrein et al. | |
| 2007/0158584 A1 | 7/2007 | Lin | |
| 2007/0158768 A1 | 7/2007 | Pilchowski et al. | |
| 2007/0164214 A1 | 7/2007 | Choi et al. | |
| 2007/0186665 A1 | 8/2007 | Hierold et al. | |
| 2007/0213419 A1 | 9/2007 | Cao et al. | |
| 2007/0218202 A1 | 9/2007 | Ajayan et al. | |
| 2007/0235713 A1 | 10/2007 | Swirbel | |
| 2007/0237990 A1 | 10/2007 | Kim | |
| 2007/0253889 A1 * | 11/2007 | Awano et al. | 423/447.3 |
| 2008/0067494 A1 * | 3/2008 | Mammana et al. | 257/10 |
| 2009/0053859 A1 * | 2/2009 | Xu et al. | 438/118 |
| 2009/0066352 A1 | 3/2009 | Gritters et al. | |
| 2009/0091343 A1 | 4/2009 | Wu et al. | |
| 2009/0197484 A1 | 8/2009 | Chen et al. | |
| 2010/0083489 A1 | 4/2010 | Eldridge | |
| 2010/0252317 A1 | 10/2010 | Gritters | |
| 2010/0253375 A1 | 10/2010 | Fang | |
| 2012/0086004 A1 | 4/2012 | Fang et al. | |

FOREIGN PATENT DOCUMENTS

| | | |
|---|---|---|
| JP | 2004286570 | 10/2004 |
| WO | WO 00/73204 | 12/2000 |
| WO | WO 03/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |

OTHER PUBLICATIONS

Moloni et al., "Sharpened Carbon Nanotube Probes" (University of Wisconsin-Madison) (no date but downloaded from Internet on Sep. 6, 2007) (8 pages).

Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006) (1 page).

Yong Chen, et al., "Nanoscale Molecular-Switch Devices Fabricated by Imprint Lithography", Applied Physics Letters, Mar. 10, 2003, pp. 1610-1612, vol. 82.

B.Q. Wei, et al., "Growing Pillars of Densely Packed Carbon Nanotubes on Ni-coated Silica", Carbon, 2002, pp. 47-51, vol. 40.

Hutchens et al., "In situ Mechanical Testing Reveals Periodic Buckle Nucleation and Propagation in Carbon Nanotube Bundles," Adv. Funct. Mater. 2010, 20 (Wiley-VCH Verlag GmbH & Co.) (2010), pp. 2338-2346.

Yaglioglu et al., "Method of Characterizing Electrical Contact Properties of Carbon Nanotube Coated Surfaces," Review of Scientific Instruments 77, 095105 (American Institute of Physics 2006), 3 pages.

Greene, "Researchers Make Carbon Nanotubes Without Metal Catalyst," MIT News (Aug. 10, 2009) (2 pages).

Pushparaj et al., "Effects of compressive strains on electrical conductivities of a macroscale carbon nanotube block," Applied Physics Letters 91, 153116 (2007) (3 pages).

Yaglioglu et al., "Conductive Carbon Nanotube Composite Micro-Probes," Advanced Materials (2008), pp. 357-362.

Yaglioglu, "Carbon Nanotube Based Electromechanical Probes," Thesis (Massachusetts Institute of Technology Jun. 2007) (137 pages).

* cited by examiner

TEMPORARY PLANAR ELECTRICAL CONTACT DEVICE AND METHOD USING VERTICALLY-COMPRESSIBLE NANOTUBE CONTACT STRUCTURES

RELATED APPLICATION INFORMATION

This application is a continuation of U.S. patent application Ser. No. 12/211,354, filed Sep. 16, 2008, entitled "Temporary Planar Electrical Contact Device and Method Using Vertically-Compressible Nanotube Contact Structures", which is a divisional of U.S. patent application Ser. No. 11/426,249, filed Jun. 23, 2006, and issued as U.S. Pat. No. 7,439,731, on Oct. 21, 2008, entitled "Temporary Planar Electrical Contact Device and Method Using Vertically-Compressible Nanotube Contact Structures", which claims the benefit of the following U.S. Provisional Applications:

Provisional Application Ser. No. 60/694,049 filed Jun. 24, 2005 entitled "Wafer-scale test probe card using nanotube vertically-compressible contact structures for the purpose of wafer-level-burn-in and wafer-level test;"

Provisional Application Ser. No. 60/757,444 filed Jan. 9, 2006 entitled "Method and apparatus for making temporary contact to a planar electrical device, such as a semiconductor wafer or flat panel;" and Provisional Application Ser. No. 60/778,205 filed Mar. 2, 2006 entitled "Method and apparatus for making temporary electrical contact to a planar electrical device, such as a semiconductor wafer or flat panel."

Each of these Applications is hereby incorporated herein by reference in its entirety.

TECHNICAL FIELD

The present invention relates in general to integrated circuit (IC) devices and, more particularly, to a method and apparatus for burn-in and testing of such devices, and similar planar structures using nanotubes.

BACKGROUND OF THE INVENTION

Large numbers of identical integrated circuits (ICs) such as microprocessors, memory devices, and digital signal processing devices are generally fabricated on a silicon wafer. Due to defects that may occur during fabrication, each IC (or "die") on the wafer is typically separately tested or sorted by test equipment such as automatic test equipment (ATE) and probe cards. Probe cards may be capable of making temporary conductive contact to a single die or a small cluster of dice, and in limited applications, whole wafers. The ATE may complete the wafer-level test by sequentially stepping a probe card through the individual die or die-cluster locations across the wafer until all dice on the wafer have been tested. The test signals are provided to each die through input or input/output bond pads on each die, and the test results are monitored on output bond pads. The good die that pass the wafer-level test are then singulated and packaged typically by electrically connecting the bond pads to the package with bond wires, solder balls, or other contact structures. To accommodate the bonding wires or solder balls, the bond pads are generally very large relative to the circuit elements of the integrated circuit. Typical bond pad sizes are on the order of 100 um (micrometers)×100 um. The bond pads are also typically aligned in regular patterns such as peripherally along the outside perimeter of the die, in a grid pattern, or in a column or row generally through the center of the die (lead-on-center).

While wafer-"level" test is well established in the industry, there is no accepted means for wafer-"scale" test or wafer-"level" "burn-in." Moreover, established probe technologies are limited to device AC testing at or below 1-2 GHZ frequencies. The present invention overcomes these limitations.

The bond pads allow each die separately to be functionally tested for specified timing parameters (AC parameters), DC parameters, and overall operation. When probing chips or wafers, it is important to have a planar set of probe contacts so that each probe contact can make simultaneous electrical contact to a respective chip contact. It is also important to have the contacts on the wafer coplanar. Typically, if the tips of the probe contacts do not lie in approximately the same plane, or if some of the contacts on the wafer are out of plane, more force must be exerted on the back of the probe in an effort to engage all of the probe contacts with the chip contacts. This typically leads to non-uniform forces between the tips of the probe contacts and the wafer contacts. If too much force is placed on any one probe contact, there is a potential to degrade the chip contacts, which can detrimentally affect device performance and consequently affect device yield. Planarity and uniform probe contact force are also important in order to have approximately the same ohmic resistance across all of the probe contacts so that the electrical signals have approximately the same level of integrity. Loss in signal integrity can detrimentally affect device performance and consequently affect device yield. In most cases, there can be hundreds of thousands of contacts across a single wafer. Maintaining similar ohmic probe to chip contact resistance is especially important for accurate testing of chips that are designed to be run at high speeds. For such high speed chips, it is also important to control the impedance of the probe tester (resistance, capacitance & inductance) as a whole to maintain the integrity of the electrical signals to allow the desired range of parametric testing.

In a conventional manufacturing process flow, following packaging, the ICs are subjected to what is referred to in the industry as a Burn-In (BI) process, in which the ICs are electrically activated simultaneously while subjected to temperature cycling over a period of hours to days. This burn-in process is used to accelerate and screen early life failures of the ICs, thus ensuring high reliability of the component. In this conventional process, the packaged ICs are inserted into an electrical socket which makes contact to the IC package pins. The burn-in sockets are mounted to large burn-in boards which are loaded into large thermal cycling ovens which can handle very large volumes of ICs. The burn-in sockets are designed to take advantage of the large pin spacing and pin size in comparison to the finer bond-pad pitch and size as described previously. Although at a very high cost to the electronics industry, the relatively large pin size and spacing and relatively low pin count and high planarity found within a single die, has enabled the single-die-per-socket IC burn-in approach to be widely adopted.

One disadvantage of the current approach to IC burn-in is high cost. Due to the requirement for custom burn-in sockets for each new IC or IC package design, short product design lifetime (as little as 12 months) and the long burn-in cycle time, the burn-in process requires a huge investment in burn-in sockets and processing time to support the volumes of ICs which are manufactured today.

Another disadvantage of this method of IC burn-in is that it commonly must be done only after packaging of the IC or in a few instances, to singulated bare-die. While this technique can be used for conventional single-die packaging, or multi-chip packaging, this technique cannot be used when die-to-wafer or wafer-to-wafer integration of ICs is required. To enable die-to-wafer or wafer-to-wafer integration, a means to do Wafer-Level-Burn-In and Test (WLBI, WLBIT) has been proposed.

While acceptable means for wafer-level single/clustered die test and single-die burn-in have been employed, the industry has not yet found an acceptable means of employing wafer-"level" burn-in and wafer-"scale" test.

Wafer-level burn-in has not been adopted because of the lack of an acceptable solution to the problems described above, and in addition:

1. Difficulty in achieving satisfactorily uniform ohmic resistance across the wafer.

2. Due to ohmic resistance non-uniformity, and lack of contact redundancy per pad, there is no way to ensure all die are being activated, and hence, there is no way to ensure all die have been adequately burned-in, thus allowing potential early life failures to escape into the field. Because there are tens of thousands of contact pads on a wafer, which all must be contacted, this is a major problem.

3. High compressive forces are needed to compress prior-art micro-spring probe contacts in order to make good, low-ohmic resistance contact. This high compressive force damages the IC bond pad, or worse can damage the IC's dielectric layers which can be extremely fragile, especially with the recent adoption of low-k dielectric materials. In the case of bumped ICs used for chip-scale packaging, no damage to the bump surface is allowed, preventing the use of micro-spring probe cards altogether. In specific applications, there are probe contacts which contact and cut into two opposing sides of an interconnect bump, similar in principle, to a pair of tweezers. This configuration is limited to only large ball sizes/pitches such as in Ball-Grid-Array (BGA) packaged ICs.

4. When multiplying the high compressive force per contact by tens of thousands of contacts, the mechanical fixturing required to maintain this high compressive force between the wafer and probe card would be excessively large, heavy and costly for wide use in wafer-level burn-in, where ICs must be cycled for up to days within a temperature cycle oven.

5. Excessive initial cost and damage-induced cost associated with intricate, fragile mechanical structure based probe cards, such as micro-spring or membrane or Micro-Electro-Mechanical-Systems (MEMS) based probe cards, has prevented these prior-art technologies from being accepted.

What is needed is a method for wafer-level burn-in and test which resolves these problems, and provides advantages over other prior approaches proposed. These prior approaches include:

1. Epoxy-ring cantilever spring contact probe cards—use limited by variation in contact force, limited contact point aerial density due to the space required for the epoxy ring, high cost intricate manual fabrication, high electrical inductance, and IC pad pitch or pattern limited to low density pad arrays. This prior art is also known to cause severe damage to IC pads, referred to in the industry as "pad scrubbing".

2. Micro-spring probe-cards fabricated through either mechanical formation or electroplated micro-mechanical assembly—use limited by high cost, susceptibility to damage, limited to lower bond pad aerial density devices due to the minimum achievable micro-spring size, limited aerial coverage (cannot achieve full wafer-scale probing), limited or no repair-ability, susceptibility to causing IC bond pad damage through micro-indentation. Micro-indentation is unacceptable for bumped ICs, especially those used in chip-scale packaging.

3. MEMS probe card having micro-machined mechanical probes bonded to rigid substrates. Limited range or amount of probe compliance (cannot scale to full-wafer probing due to insufficient range of compliance), high cost due to many intricate fabrication steps, limited aerial coverage difficulty to repair, susceptibility to causing IC bond pad damage.

4. Membrane probe cards having micro indenting tips deposited onto the surface of a flexible circuit board—limited probe compliance, high cost, no full-wafer probing capability, high cost, limited probe contact force resulting in poor IC pad contact reliability.

Each of these methods is limited to single or small-area probing due to the highly complex, intricately assembly of microstructures associated with their application to probe cards. Due to their complexity, each prior-art method suffers from low yield and associated high cost when attempts are made to fabricate them in large arrays or at high aerial densities.

SUMMARY OF THE INVENTION

The shortcomings of the prior art are overcome and additional advantages are provided by the present invention which in one aspect is a planar electrical contact layer, facilitating temporary contact between a sample under test and a probe card substrate having a pre-arranged electrical contact pattern corresponding to a pattern on the sample. The planar layer includes a plurality of single-walled or multi-walled nanotubes, directly metallized at their bases, to allow contact to the pre-arranged electrical contact pattern on the probe card substrate.

The nanotubes may be arranged into a plurality of bundles, each bundle forming an electrical contact corresponding to areas on the sample and on the probe card between which a temporary contact is required. The bundles are compressible along their length to allow a compressive force to be used for contacting the probe card substrate to the sample. A strengthening material may be disposed around and/or infiltrate the bundles.

The nanotubes forming the bundles may be patterned to provide a pre-determined bundle profile. The profile may be nanotubes of varying height, allowing a varying degree of contact between the bundle and the sample depending on the amount of compressive force applied to the bundle.

Tips of the nanotubes of the bundles which will form the temporary contact to the sample may metallized with a conductive material to form a conformal coating on the nanotubes of the bundles; or are metallized with a conductive material to form a continuous, single contact surface. The tips may be metallized into a pre-determined shape, such as flat, pyramid, cone, ziggurat, or blade.

In operation, with bases of the bundles contacting and/or affixed to the areas of the electrical contact pattern of the probe card substrate via their metallization, the layer is positioned over the pattern on the sample, with the bundles of nanotubes in electrical contact with their respective areas on the sample, for testing of the sample using signals carried through the probe card substrate.

The sample to be tested may be a wafer having multiple, individual die, and wherein the layer and the bundles formed thereon are sized to simultaneously contact and test a single, all or substantially all of the individual die across the wafer, with the nanotubes of a size small enough to contact electrical patterns on the individual die (e.g., <250 nm, preferably <100 nm).

To form the electrical probe discussed above, in one embodiment, an arrangement of nanotubes is formed on a first substrate. A second substrate is provided having a pre-arranged electrical contact pattern corresponding to a pattern on a sample to be tested. At least some of the nanotubes are transferred from the first substrate to the second substrate, thereby forming a probe device comprising the second substrate and the transferred nanotubes.

To effect the transfer, a conductive material may be applied to the ends of the nanotubes, and/or to the second substrate in areas to which the nanotubes are to be contacted; and the first and second substrates are aligned and moved together such that the ends of the nanotubes contact and adhere to the areas of the second substrate, by activating the conductive material to facilitate adhesion of the ends of the nanotubes to the areas. The substrates may then be moved apart such that the nanotubes separate from the first substrate and remain attached to the areas of the second substrate.

In another embodiment for forming an electrical probe device, a substantially homogeneous layer of nanotubes is formed over a first substrate. A second substrate is provided having a pre-arranged electrical contact pattern corresponding to a pattern on a sample to be tested. At least some of the nanotubes are transferred from the first substrate to the electrical contact pattern on the second substrate, thereby forming the probe device having the second substrate and the transferred nanotubes. To effect the transfer, the layer of nanotubes is removed from the first substrate and bonded to the second substrate. Some nanotubes transferred to the second substrate are ablated (e.g., laser ablation) at areas in which no nanotubes are desired. After ablation, the nanotubes form a plurality of bundles, each bundle forming an electrical contact corresponding to a point on the test sample to which a temporary contact is required.

In another embodiment, a method is provided for forming a probe interface layer for temporarily carrying signals between a probe card and a sample under test. A plurality of bundles of nanotubes is formed over a substrate, and a strengthening material is disposed around the bundles, with the strengthening material and bundles together forming a layer. The layer is removed from the substrate such that the bundles run from an upper surface of the layer to a lower surface of the layer. The removed layer comprises the probe interface layer, having a custom or generalized pattern, serving as an interface between a probe card and a sample under test. The layer can have a generalized pattern, such that it can be used temporarily between a probe card's contact pattern and a sample under test, independent of the particular pattern on the probe card, with any non-contacted bundles simply going un-used.

Further additional features and advantages are realized through the apparatus and techniques of the present invention. Other embodiments and aspects of the invention are described in detail herein and are considered a part of the claimed invention.

BRIEF DESCRIPTION OF THE DRAWINGS

The subject matter regarded as the invention is particularly pointed out and distinctly claimed at the conclusion of the specification. The foregoing and other objects, features, and advantages of the invention are apparent from the following detailed description taken with the accompanying drawings in which:

DESCRIPTION OF THE INVENTION

The present invention relates to the test or burn-in of semiconductor integrated circuits (ICs) or other, integrated electrical components, such as, but not limited to Light Emitting Diodes, (LEDs), Flat Panel Displays (FPDs), Electrical Transducing circuits, or other such planar electrical circuits. For simplicity, all of these types of electrical devices will be referred to as Integrated Circuits (ICs). The present invention includes a new method to make temporary electrical contact to ICs, for the purpose of either testing or activating the electrical device. The bond pads are disposed on the IC in a predetermined alignment such as a peripheral, grid, or lead-on-center alignment. This invention relates to a new method of making temporary contact to such a range of IC bond pad configurations. The present invention also includes the unique processes used to produce articles which employ the new method described herein. The present invention applies to the testing or activation of a single device or simultaneous activation of multiple planar electrical devices, ICs. The present invention can be described as an arrangement of electrical contactors to form what is commonly referred to as a Probe Card, Test Head, Burn-In Card or Burn-In Socket. This invention will be referred to as a probe card or test head assembly for simplicity.

This invention includes a new probe-card or test head concept that utilizes any three-dimensional nano-structure, such as Carbon-Nano-Tubes (CNTs) or Germanium-Nano-Tubes (GeNTs), as an integral part of the electrical contacting method. These structures will be referred to as NanoTubes (NTs). This invention describes the unique advantages of such NT-based probe cards, designed to solve specific, known problems in the IC manufacturing industry. This invention describes special processes which enable the fabrication of these NT probe cards in such unique configurations.

Figure 5A:
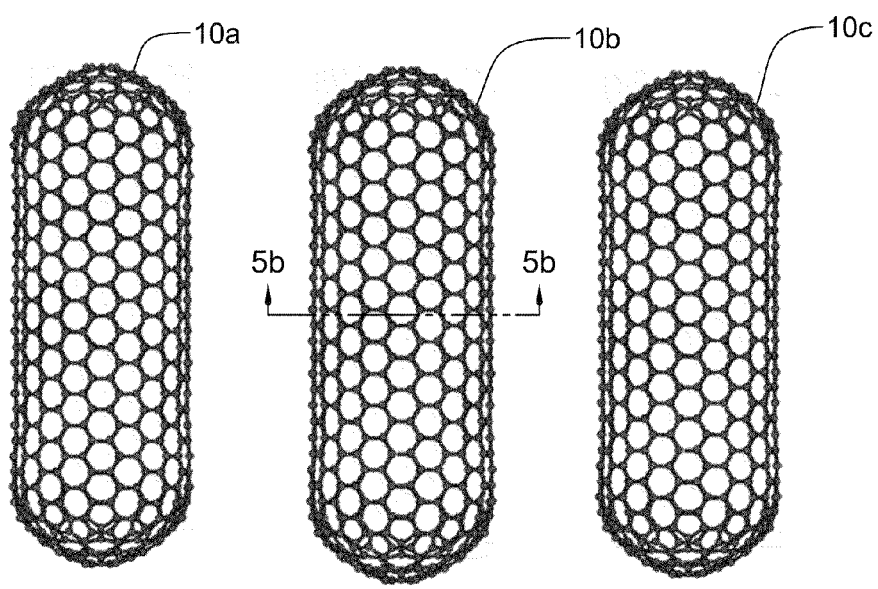
FIGS. 5a-b depicts a set of example nanotubes, single-walled or multi walled.
Figure 5B:
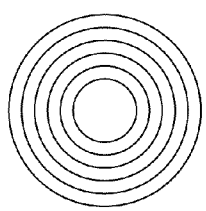

As discussed above the present invention involves the formation of long-chain, three-dimensional-molecule NTs of the exemplary types 10a, 10b, and 10c shown in FIG. 5a deposited orthogonally onto the surface of a planar first substrate (not shown). The first substrate provides a base in which a regular, defined pattern of NTs can be formed and held in place. The first substrate can also form a planar mandrel or mold, into which NTs can be temporarily deposited and subsequently transferred to a second substrate. The first substrate may be specifically used for the growth of the NTs, while the second substrate may be used to form electrical interconnections to the NTs. The NTs 10 have the characteristic of being highly electrically conductive axially, and relatively electrically insulative, radially. When highly insulative, radially, this gives the NTs the unique characteristic similar to that of microscopic insulated wire, or of an electrically conductive, vertically-compressible pillar, capable of carrying an electrical current from the base to the tip. The NTs can be either Single-Walled Nano-Tubes (SWNT) or Multi-Walled Nano-Tubes (MWNT). One example of a nanotube is formed of a graphene Carbon-Lattice rolled into a cylindrical "tube." The structure is based on the C60 "Buckyball." Typical mechanical properties include elastic columnar-beam behavior, naturally vertical structure, with a density in the millions/cm2. Typical electrical characteristics include metallic behavior, with current densities up to 109 A/cm2. A cross-section of a multi-walled nanotube is shown schematically in FIG. 5b. A multi-walled tube may include concentric graphene cylinders, 10-30 walls, with an outer diameter of 10-30 nm. Potential Advantages of multi-walled tubes include high current carrying capacity (CCC), crash-tolerance (resilient), probe-over-active/low-K possible, tailored pad force, low LC, fast rise times (low-L, low-K<0.25 g/cm3), sub-10 um-sq pad on <20 um pitch, scalability, cost effective/short lead-time, and low cost manufacturing—LPCVD process.

The first substrate can be chemically modified to allow selective growth of the NT molecules. This modification can be achieved through:

1. Deposition and patterning of a chemically inert layer over a chemically active substrate. The patterned inert layer blocks regions of the surface of the substrate, thus defining the inclusion and exclusion zones for deposition of the NT molecules. The inclusion zones, are those in which chemically active regions of the substrate are exposed to the reagents during NT deposition. The exclusion zones are those areas below the patterned inert layer for which the nucleation sites of the NT molecules are blocked.

2. Deposition, patterning and directly etching a chemically active layer on the substrate, which will define the subsequent inclusion and exclusion zones of NT deposition. This active layer performs either a nucleation or catalytic reaction during the deposition of the NTs. The exclusion zones are those areas in which this active layer has been removed. The inclusion zones are those in which the active layer remains (e.g., Process Flow 1 below). As discussed below, the active layer can be placed into a Chemical Vapor Deposition (CVD) chamber, with one or more catalytic precursor gases flown into the chamber and the NTs 112 are grown only in the areas in which the active-area film exists to a range of 100 um to 2 mm, preferably 200 um to 500 um, with maximum tube density.

The constituency of the NTs discussed herein can be altered to optimize particularly desirable characteristics in many ways, enabling the electrical and mechanical characteristics of the probe card to be tailored to a particular application. Some of these modifiers include but are not limited to:

1. Chemical doping segments of the NT pillar during or after completion of the NT deposition step. These modifiers may include the use of organo-metallics, or other pre-cursors or material groups. Thus, the electrical characteristics at specific locations on the NT can be modified with other semiconductors or metallics such as: Ge, Pd, Co., etc.

2. The NT vertical pillars can be branched at a desired stage in the deposition process to form a horizontal plane, web-like or mesh-like surface. This surface can be useful in structurally linking the NTs together at a desired location for the purpose of increasing compressive stiffness or improving the overall rigidity of the NT bundles.

3. The compression force or "spring rate" of the NT probe contact can be modified by varying certain process conditions during the NT deposition to selectively produce Single-Walled Nano-Tubes (SWNT) or Multi-Walled Nano-Tubes (MWNT). This characteristic can result in the equivalent of a progressive-spring rate compression spring. Preferably, the bundles are compressible between 2.5% and 25% of their length.

4. The NT pillar compression morphology can be modified to ensure that the NTs vertically collapse or "buckle" under compressive load rather than flatten out laterally. This buckling phenomenon allows the NT pillar deformation be confined to the space within the natural spacing between adjacent NT pillars. This spacing between NT pillars is typically is between 30-60 nm, while the NT pillar is typically between 10-30 nm in diameter. NT pillars which have undergone the maximum compression, typically down to 10% of their original length, exhibit a buckling pattern that has the appearance of a pleated fabric. Thus the NT pillars bundles can undergo 90% compression (i.e., compress to 10% of original length) without any observable spread in the outermost boundary of the NT pillar bundles.

The NT vertically-conducting pillars have another unique characteristic of being highly compressible, elastic and resilient—thus capable of performing as electrically conductive vertical micro-springs, which can be compressed repetitively without deformation or fracture. As described herein, the first or second substrate on which the NTs are deposited can also be electrically conductive, thus allowing electrical current to be carried through the substrate through the NTs, and finally to the electrical device.

Figure 6:
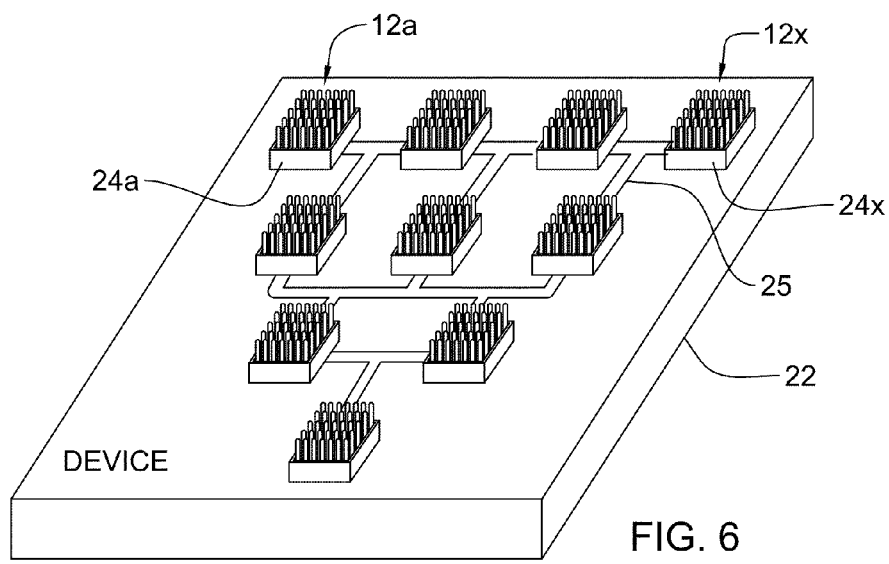
FIG. 6 is an isometric view of an exemplary probe card of the present invention.
Figure 7:
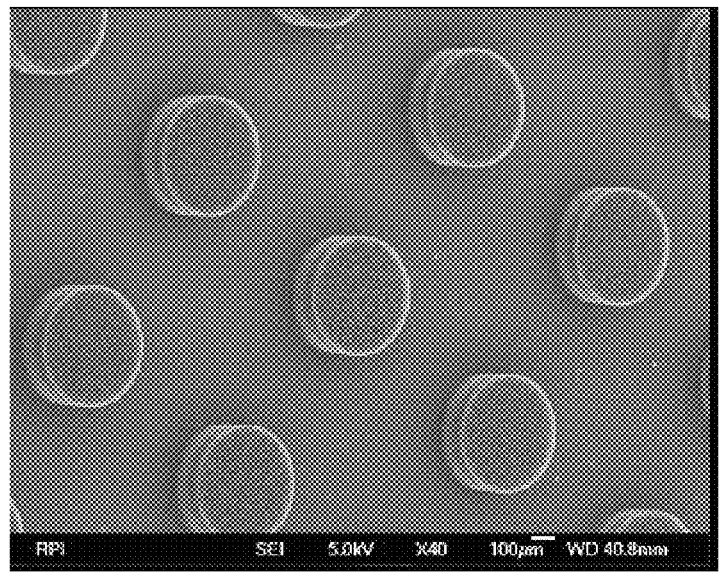
FIG. 7 is a photograph of bundles of nanotubes representative of the probe card of the present invention.

As an opening example of the structure of a probe card 52 in accordance with the present invention, with reference to FIG. 6, the NTs can arranged into a wafer-scale or panel-scale array of bundles 12a . . . 12x of electrically conductive vertically-compressible NT pillars which can be patterned in pad areas 24a . . . 24x and which align specifically to the electrical input-out bond pads of an electrical device (IC) under test (not shown). By forming the NTs in this way onto pad areas 24a . . . 24x, the NTs form highly redundant contacts, ensuring a multitude of high-electrical-continuity contacts are made between a contact pattern 25 on the probe card substrate 22 and the IC (not shown) through the NT bundles 12. With reference to FIG. 7, a photograph of a similar arrangement of exemplary circular nanotube bundles 60 is shown, projecting from an underlying substrate. The bundles are spaced to ensure electrical isolation between adjacent bundles.

Thus, the present invention includes the formation of NTs, designed and fabricated in such a way as to serve the purpose of a resilient, electrical contactor for the purpose of testing or burn-in of an electrical device, such as an IC. NT-based electrical contacts provide another distinct advantage in that they have an exceptionally high thermal conductivity (K reported up to 6600 W/mK, ref. Berber et. al.), allowing the probe card to be used to conduct heat into or out of the ICs at specific, locations.

Figure 1A:
FIGS. 1a-o depict a process flow and associated structures for forming a probe card in accordance with a first embodiment of the present invention.
Figure 1B:
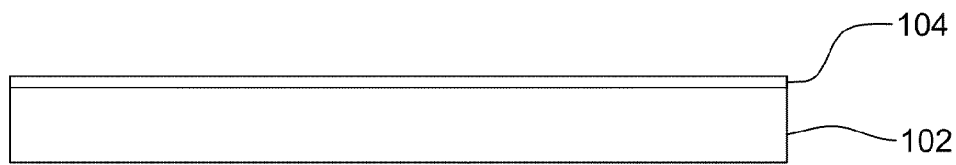

One skilled in the art will recognize that the following fabrication processes are not intended to be exclusive, and any "combination" of any of the disclosed steps, techniques and/or devices fall within the scope of the present invention. One skilled in the art will also recognize that the figures represent side, cross-sectional views of planar structures, such as the planar structures shown isometrically in FIGS. 6 and 7 (discussed above), and are not meant to limit the pattern or dimensions of the bundle and substrate structures depicted. Example Fabrication Process Flow 1 for Fabricating an NT-Based Probe Card, with Reference to FIGS. 1a-o:

1. Substrate preparation.
   a. If 3-dimensional arrangement of NTs is required, the substrate surface is patterned to form a negative profile of the desired NT profile, similar to the approach used to form a casting mold. This 3-dimensional profile might be an array of recessed valleys with pyramid or conical shapes or any other desired profile. See the discussion below regarding FIGS. 3m-o. Here, in FIG. 1a, substrate 102 is shown without profiling for simplicity.

b. In FIG. 1b, typically an active surface 104 is deposited onto the substrate 102 after surface profile formation is complete. An active surface is typically SiO2, but can have any number of suitable materials, including but not limited to Al2O3, SiN, SiON. This forms the chemically active layer onto which nucleation of the NT deposition is performed.

c. The active layer thickness can be varied across the first substrate to selectively control the NT growth rate, thus selectively affecting the ultimate length of the NTs.

Figure 1C:
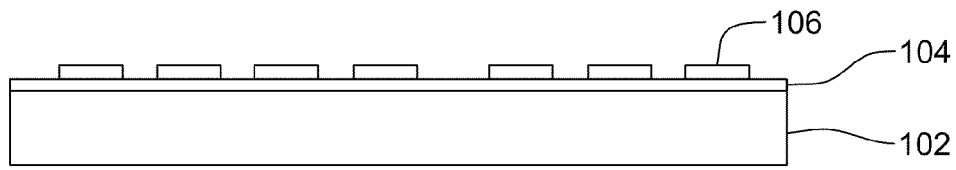

2. In FIG. 1c, areas in which deposition of NTs is desired are masked over using an appropriate photoresist pattern 106.

Figure 1D:
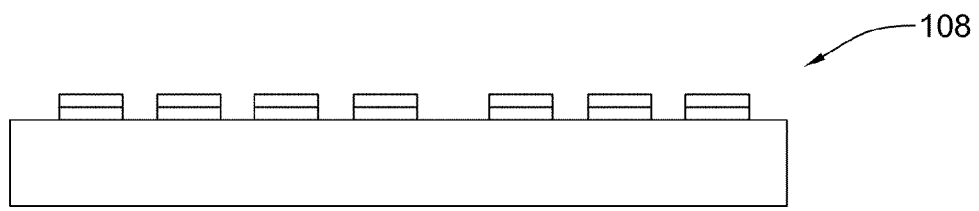
Figure 1E:
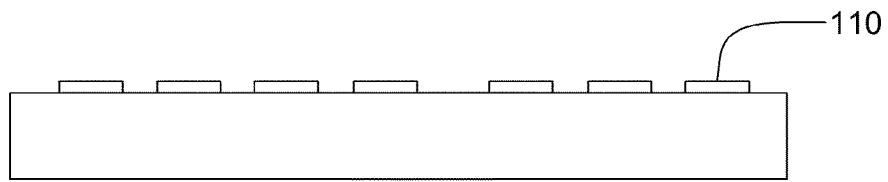

3. In FIG. 1d, the active layer is etched away 108 in areas not masked by the photoresist, leaving a pattern of remaining active-area islands 110 where the NTs will be subsequently grown (FIG. 1e). Those skilled in the art will recognize that the above is a generalization of the steps necessary to form active areas 110, and that any other known lithographic techniques can be used, including the above-described technique of using a chemically active uniform layer, and masking areas to inhibit NT growth.

Figure 1F:
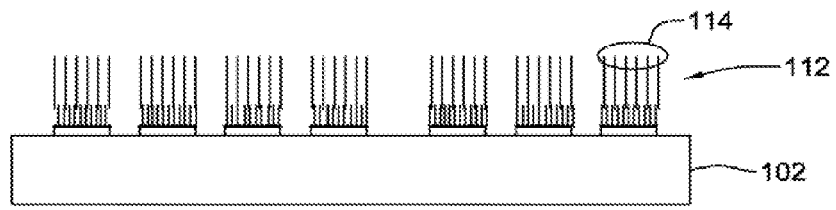

4. In FIG. 1f, the substrate can be cleaned and placed into a Chemical Vapor Deposition (CVD) chamber, a precursor gas is flown into the chamber and the NTs 112 are grown only in the areas in which the active-area film exists.

5. In the preferred embodiment of the process, the NTs uniquely grow in bundles 114 of independent vertical pillars which are weakly attached to the SiO2 base films.

6. At this step we are left with a full wafer-scale array of patterned NT bundles 112, which were grown into a 3-dimensional surface pattern previously formed into the surface of the substrate and weakly attached to this first substrate 102.

Figure 1G:
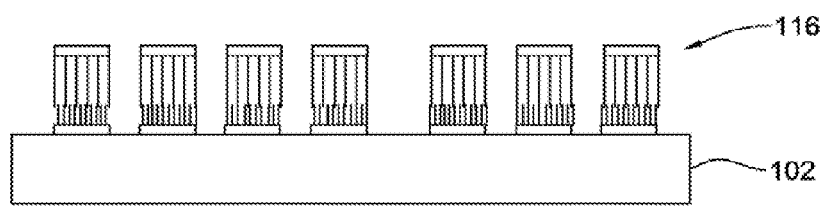

7. In FIG. 1g, the bundles of NTs may be joined together 116 at the upper surface defined by the confluence of the ends of the NT vertical pillars. Joining processes include but are not limited to:
   i. Sputtering of metal or metal alloy layers
   ii. Electrolytic or electroless plating of metal or metal alloys
   iii. Molten metal capillary flow
   iv. Branching of the NTs to form structural-molecular links or chemical bonds between NTs
   v. Application of a polymer layer
   vi. Application of a tape or other temporary binder.
   vii. Reliance on naturally occurring van der Waals attraction forces to hold the intimately layered NT bases together 8. Once the NT bundles are suitably joined at the upper surface, an array of NT bundles weakly attached to the first substrate 102 is ready for the next step. Starting at FIG. 1h, this NT array 112 (now shown inverted) can undergo transfer to a second substrate 122 which will form the base of the wafer-scale probe-card.

Figure 1H:
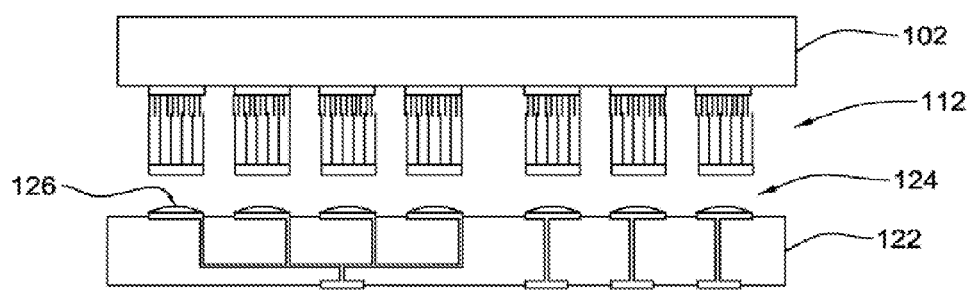

9. In FIG. 1h, the second substrate 122 may first be patterned with a suitable electrical interconnect or signal routing pattern 124 designed for a specific IC wafer, such as previously described in the Background. It is through these electrical interconnects 124 that the ICs will be activated and tested. Electrical pad areas can be patterned on the outermost surface which will be joined to the NT bundles, through which an electrical connection to the NT bundles will be formed. A final step in the preparation of the probe card base 122 is to deposit a reflow-able metal solder eutectic 126 onto the electrical pad areas, which will be used to form the metallurgical bond to the NT bundles. This second substrate 122 becomes the probe card base, while the NTs 112 form the vertically-compressive electrically conductive contacts between the probe card and the ICs.

10. This secondary substrate 122 or probe card base (henceforth referred to as the probe card base) may have a silicon wafer, glass panel or printed circuit board combined with a series of patterned electrical conductors and insulation layers, provided to bring the power, ground and high frequency signals into the IC wafer. This probe card base may have a number of desirable integrated electrical functions such as a capacitor array or resistor array as needed.

11. The NT array described above is next joined to the probe card base. The joining process involves the creation of a metallurgical bond between the bases of the NT bundles and the electrical pads on the probe card base.

Figure 1I:
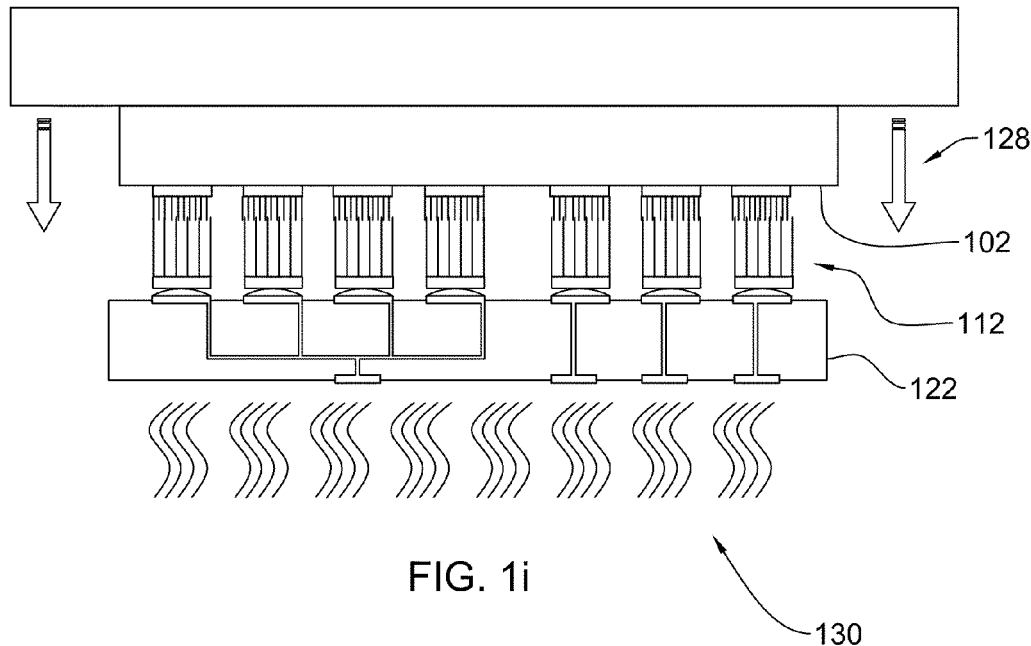

12. In FIG. 1i, the NT array "fabric", while still weakly attached to the first substrate, is aligned to the aforementioned electrical pad pattern on the probe card base and pressed 128 into contact with the electrical pads; and the first substrate 102 and probe card base 122 are clamped into a fixed and aligned position relative to each other to form a stack.

13. The stack is then reflowed at a temperature 130 above the melting point of the metal solder 126 previously deposited onto the electrical pad areas of the probe card base. Once the reflow step is complete, a metallurgical bond is formed between the NT bundles and the probe card base electrical pads.

14. At this stage (FIG. 1j), the NT bundles are strongly attached to the probe card base 122 through metallurgical bonds 132 and weakly attached to the first substrate 102.

Figure 1J:
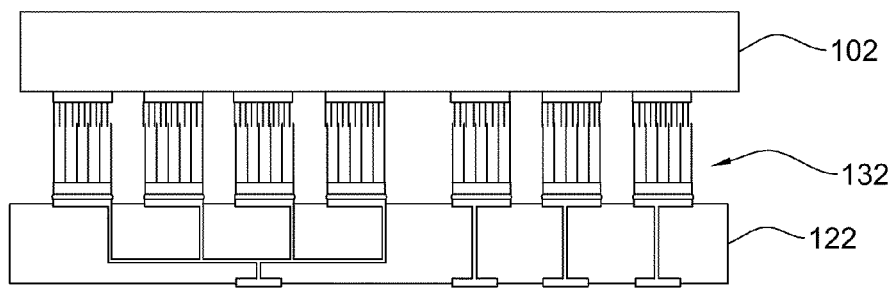
Figure 1K:
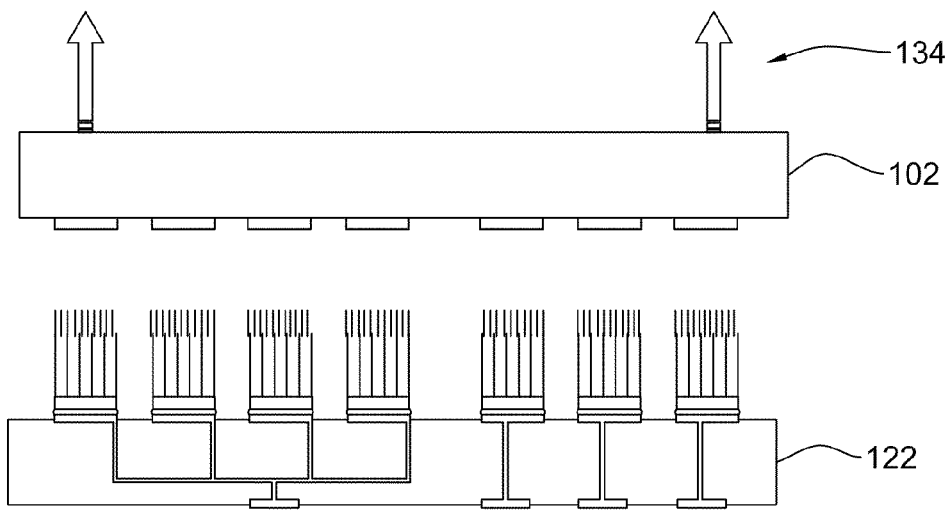
Figure 1L:
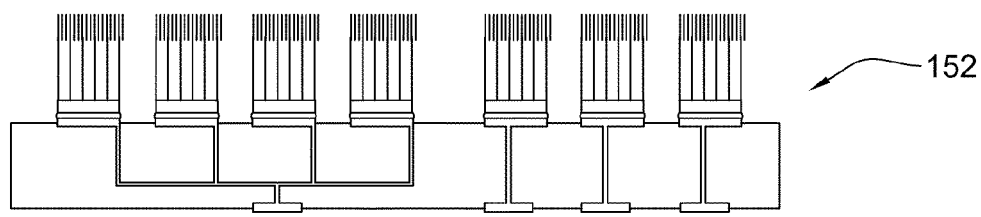

15. In FIG. 1k, the first substrate 102 is then removed 134, leaving the NT bundle arrays metallurgically bonded to the second, electrically active substrate 122. This is made possible by strong adhesion to the second substrate and the weak adhesion to the first. In FIG. 1l, the resulting probe card 152 is shown.

Figure 1M:
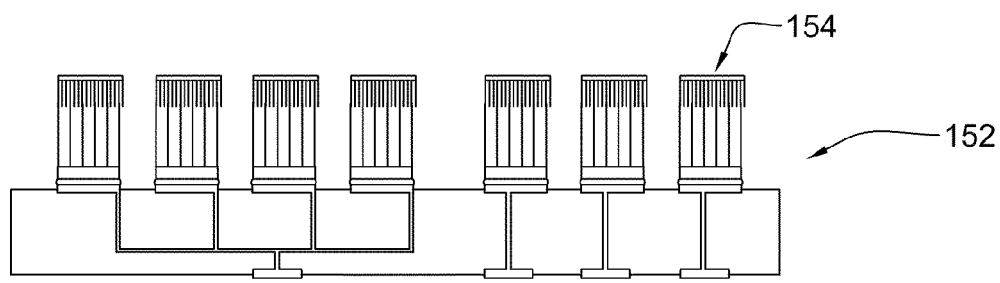
Figure 1N:
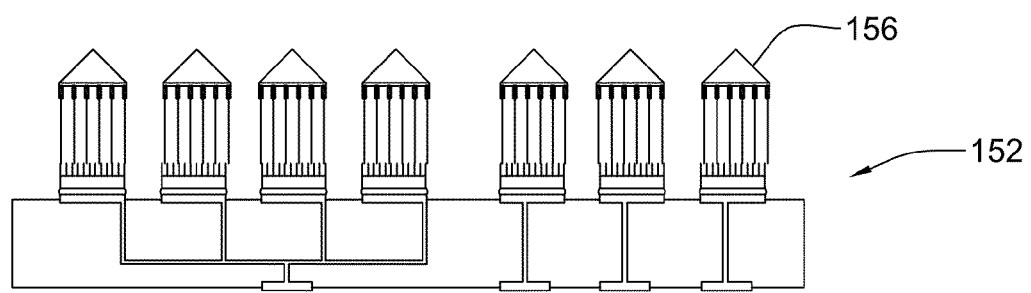
Figure 1O:
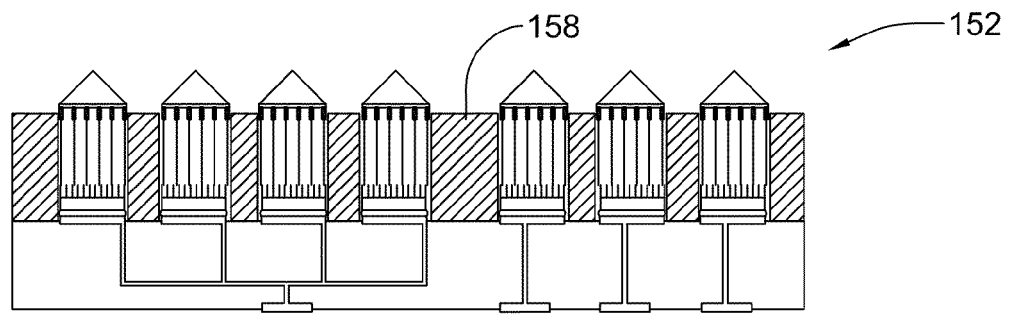

16. Any surface treatment to the NT tips can be done at this point as the top surface of the NTs is now exposed. Treatments might include chemical activation, metal deposition, etc. For example, with reference to FIG. 1m, a layer of metallization 154 can be deposited (e.g., Ni/NiCo, or Ni/Au). With reference to FIG. 1n, lithographically defined, pyramid shaped caps 156 can be attached to the bundle tips. Top surface options to cover also include: as deposited; post processed treated to sharpen tips; prior to metallization cover option of opening ends of NTs to allow contact to multiple walls; metallized with highly conformal coating. Preferred tip metallization from: Cr, Ti, Pd, Ni, Rh, Pt, Co, NiCo, PdCo, W. With reference to FIG. 1o, an optional infiltration of a strengthening material, e.g., a polymer/elastomer 158, between and/or into the bundles can be employed to address fragmentation risk and add structural integrity. The polymer is preferably PI or PMMA.

17. The result is a high aerial density, fine-pitch, highly compliant wafer-scale probe card 152 having an array of vertically-compressible, electrically conducting NT bundles metallurgically bonded to an electrically active probe card base.

Alternative Fabrication Process Flow 2 for Fabricating an NT-Based Probe Card, with Reference to FIGS. 2a-j:

1. Substrate preparation.
   a. Typically an active surface is deposited onto the substrate after surface profile formation is complete. An active surface is typically SiO2, but may be any number of suitable materials, including but not limited to Al2O3, SiN, SiON. This forms the chemically active layer onto which nucleation of the NT deposition is performed. See the discussion regarding FIGS. 3m-o below for possible profiling. Here, in FIG. 2a substrate 202 is shown without profiling for simplicity.

b. The active layer thickness can be varied across the first substrate to selectively control the NT growth rate, thus selectively affecting the ultimate length of the NTs.

2. The substrate may be cleaned and placed into a Chemical Vapor Deposition (CVD) chamber, a precursor gas is flown into the chamber and the NTs 212 are grown uniformly across the surface of the active first substrate.

3. At this step (FIG. 2b) we are left with a full wafer-scale array of a uniform distribution layer 212 of un-patterned NT pillars, forming a fabric weakly attached to the first substrate.

4. The upper ends of the NTs may be joined together 204 (FIG. 2b) at the upper surface defined by the confluence of the ends of the NT vertical pillars. Joining processes include but are not limited to:
  i. Evaporation or Sputtering of metal or metal alloy layers
  ii. Electrolytic or electroless plating of metal or metal alloys
  iii. Molten metal capillary flow
  iv. Branching of the NTs to form structural-molecular links or chemical bonds between NTs
  v. Application of a polymer layer
  vi. Application of a tape or other temporary binder
  vii. Reliance on naturally occurring van der Waals attraction forces to hold the intimately layered NT bases together.

5. The NTs are suitably joined at the upper surface 204, forming a fabric of NT pillars, weakly attached to the first substrate 202. This NT pillar fabric can now undergo transfer to a second substrate 222 (FIG. 2c) which will form the wafer-scale probe-card. (In all embodiments herein, the bundle fabric can undergo one or more transfers to one or more temporary carrying substrates, for the purposes of additional processing, exposure/metallization, or changing the direction/polarity of the bundles on the final substrate.)

6. The second substrate 222 may first be patterned with a suitable electrical interconnect or signal routing pattern 224 designed for a specific IC wafer, such as previously described in the Background section. It is through these electrical interconnects that the ICs will be activated and tested. Electrical pad areas are patterned on the outermost surface which will be joined to the NT bundles, through which an electrical connection to the NT bundles will be formed. A final step (FIG. 2c) in the preparation of the probe card base is to deposit e.g., a reflow-able metal solder eutectic 226 onto the electrical pad areas, which will be used to form the metallurgical bond to the NT bundles. This second substrate 222 becomes the probe card base, while the NTs form the vertically-compressive electrically conductive contacts between the probe card and the ICs.

7. If a 3-dimensional arrangement of NTs is required, the electrical bond pads on the second substrate surface are patterned to form a positive profile of the desired NT profile, such as a pyramid, conical or ziggurat shape.

8. This secondary substrate or probe card base 222 (henceforth referred to as the probe card base) may be a ceramic wafer, silicon wafer, glass panel or printed circuit board combined with a series of patterned electrical conductors and insulation layers, provided to bring the power, ground and high frequency signals into the IC wafer. The probe card base may either be wafer scale (to create a wafer scale probe card) or scaled for smaller for single- or multi-field or single- or multi-die level probing. This probe card base may have a number of desirable integrated electrical functions such as a capacitor array or resistor array as needed.

9. The NT array described above is next joined to the probe card base. The joining process involves the creation of a metallurgical bond between the bases of the NT bundles 212 and the electrical pads 224 on the probe card base.

10. The NT array "fabric", while still weakly attached to the first substrate (now shown inverted), is aligned (FIG. 2d) to the aforementioned electrical pad pattern on the probe card base and pressed 228 into contact with the electrical pad areas; and the first substrate 202 and probe card base 222 are clamped 228 into a fixed and aligned position relative to each other to form a stack.

11. The stack is then reflowed at a temperature 230 above the melting point of the metal solder 226 previously deposited onto the electrical pads of the probe card base. Once the reflow step is complete, a metallurgical bond is formed between the NT bundles 212 and the probe card base electrical pad areas.

12. At this stage, the NT bundles are strongly attached to the probe card base 222 through metallurgical bonds and weakly attached to the first substrate 202.

13. The first substrate is then removed 234 (FIG. 2e), leaving the NT pillars in arrays of small groups or bundles 238 metallurgically bonded to the second, electrically active substrate 222. This is made possible due to the strong adhesion to the second substrate 222 and the weak adhesion to the first 202. The NT pillars are extracted from the uniform fabric of NT pillars on the first substrate only where a metallurgical bond was formed between the NT pillars and the solder-coated electrical bond pad areas on the second substrate. Surrounding the solder-coated bond-pads, there was no adhesion to the NT pillars (FIG. 2f), thus the NT pillars located over areas in which there was no bond pad 236 are left behind, with the rest of the NT pillar fabric 238 deposited on the second substrate 222.

Figure 2A:
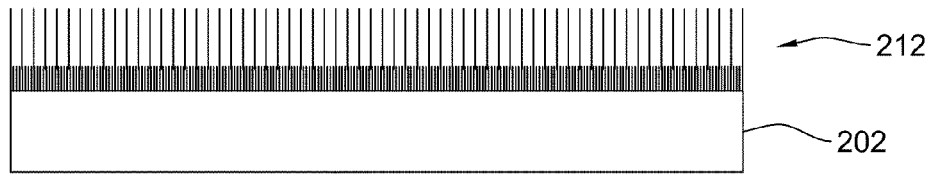
FIGS. 2a-j depict a process flow and associated structures for forming a probe card in accordance with a second embodiment of the present invention.
Figure 2B:
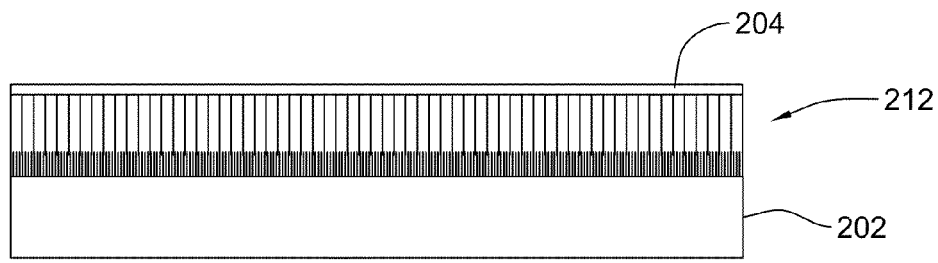
Figure 2C:
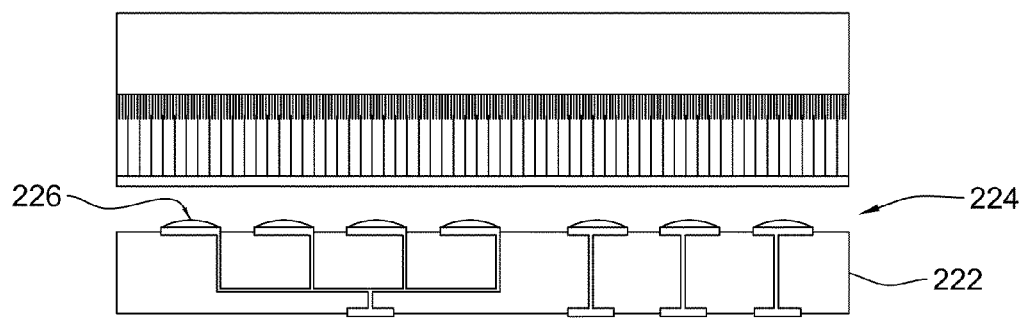
Figure 2D:
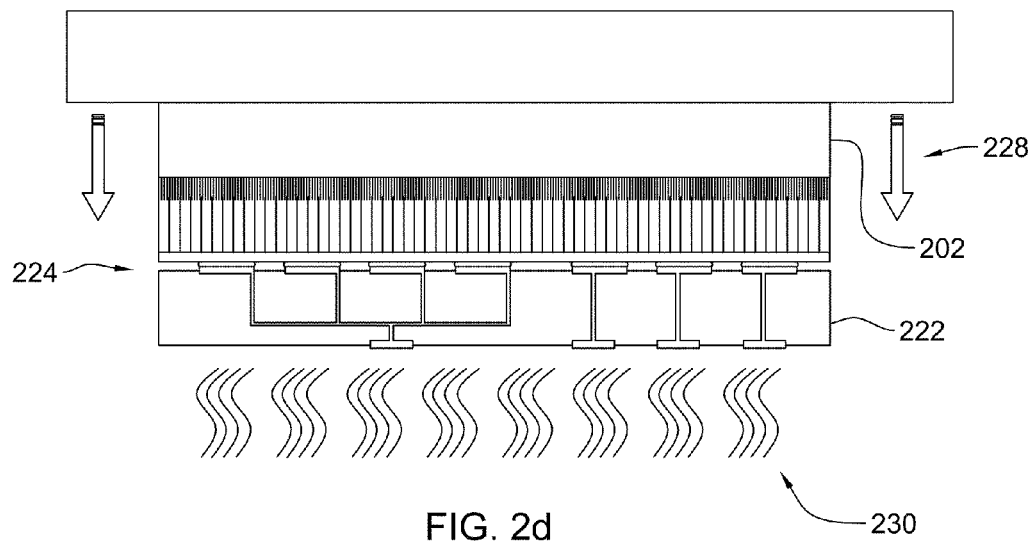
Figure 2E:
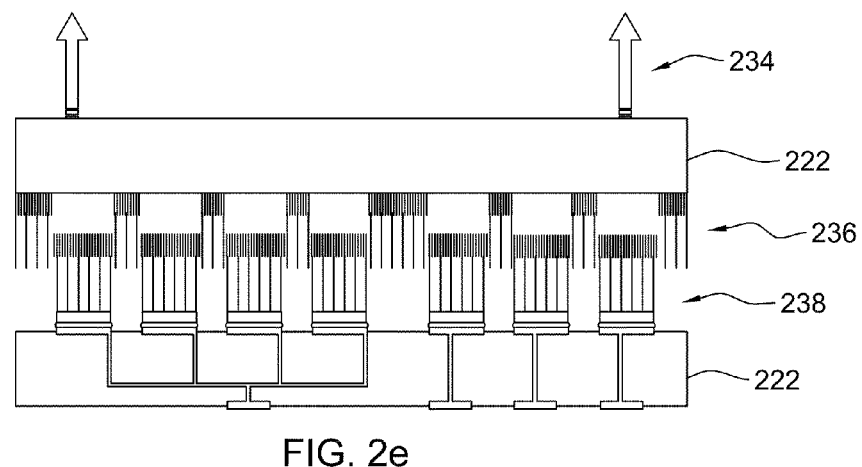
Figure 2F:
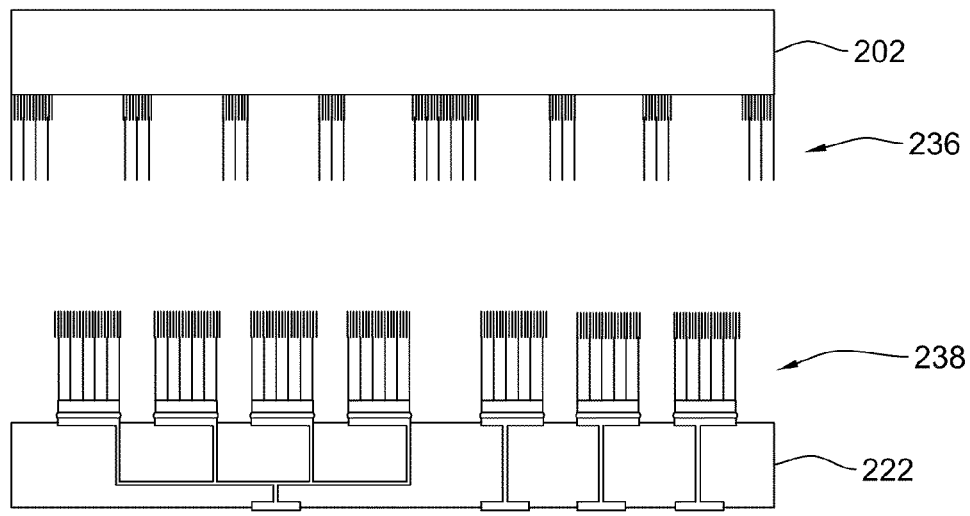
Figure 2G:
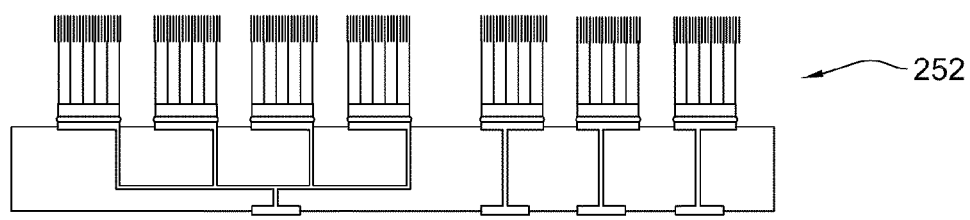
Figure 2H:
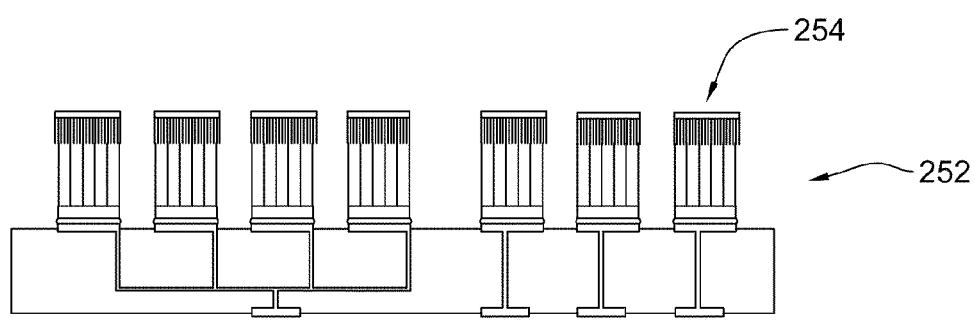

14. The NT pillars 238 that were metallurgically bonded to the second substrate (FIG. 2f) are extracted from the first substrate to form an array of NT pillar bundles. These NT pillar bundles 238 form the electrical probe contacts on the second electrically active probe card base. In FIG. 2g, the resulting probe card 252 is shown.

Figure 2I:
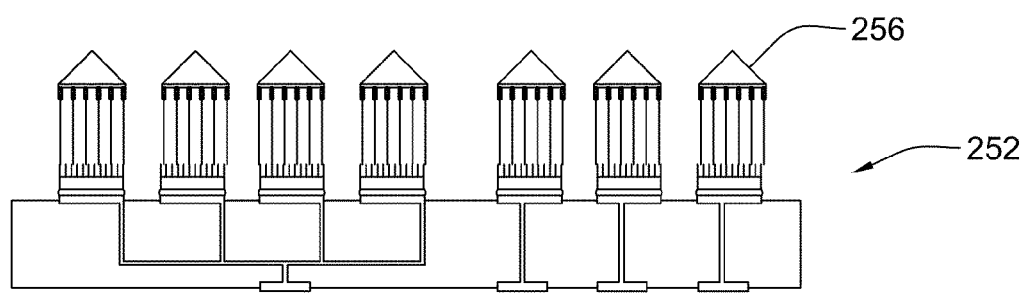
Figure 2J:
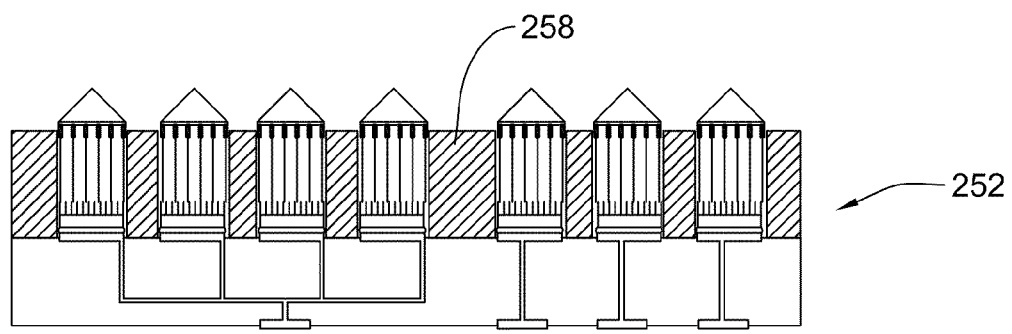

15. Any surface treatment to the NT tips can be done at this point as the top surface of the NTs is now exposed. Treatments might include chemical activation, metal deposition, etc. For example, with reference to FIG. 2h, a layer of metallization 254 can be deposited (e.g., Ni/NiCo, or Ni/Au). With reference to FIG. 2i, lithographically defined, pyramid shaped caps 256 can be attached to the bundle tips. Top surface options to cover also include: as deposited; post processed treated to sharpen tips; prior to metallization cover option of opening ends of NTs to allow contact to multiple walls; metallized with highly conformal coating. Preferred tip metallization from: Cr, Ti, Pd, Ni, Rh, Pt, Co, NiCo, PdCo, W. With reference to FIG. 1j, an optional infiltration of a strengthening material, e.g., a polymer/elastomer 258, between bundles can be employed to address fragmentation risk and add structural integrity. The polymer is preferably PI or PMMA.

16. The result is a high aerial density, fine-pitch, highly compliant wafer-scale probe card 252 (FIG. 2j) having an array of vertically-compressible, electrically conducting NT bundles metallurgically bonded to an electrically active probe card base.

Figure 3A:
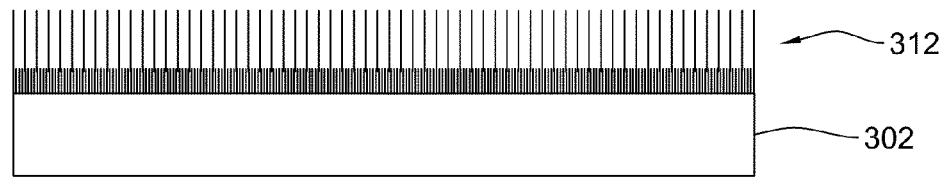
FIGS. 3a-o depict a process flow and associated structures for forming a probe card in accordance with a third embodiment of the present invention.
Figure 3B:
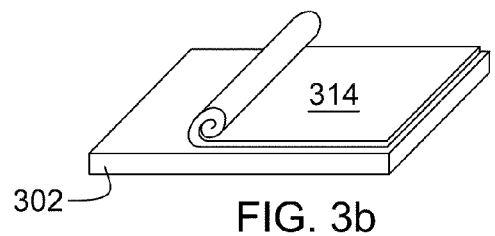
Figure 3C:
Figure 3D:
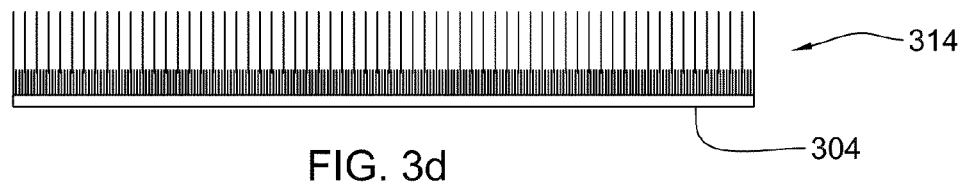
Figure 3E:
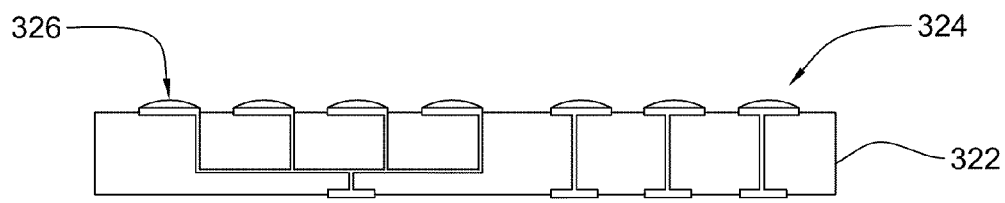
Figure 3F:
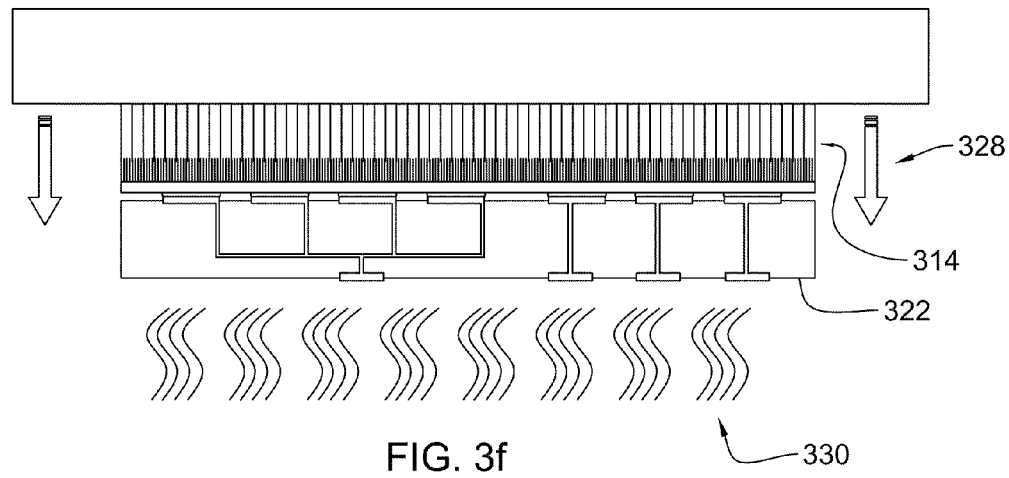
Figure 3G:
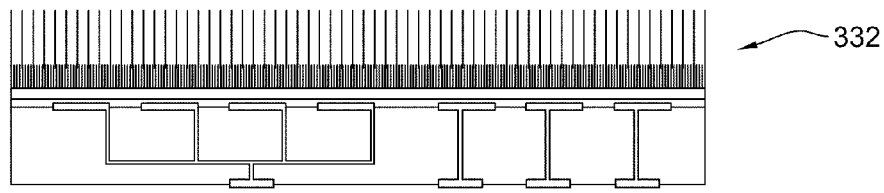
Figure 3H:
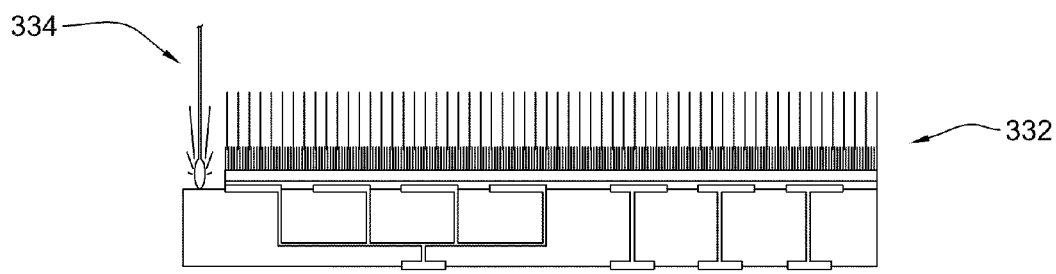
Figure 3I:
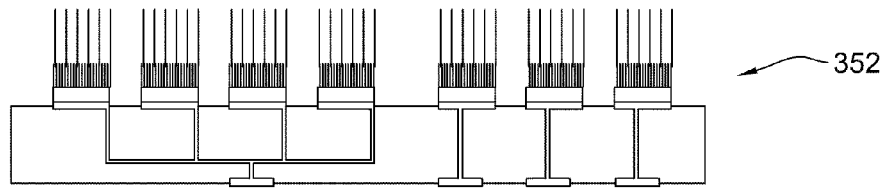
Figure 3J:
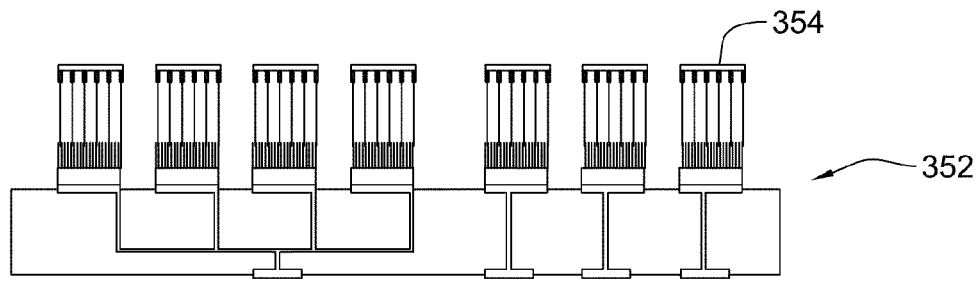
Figure 3K:
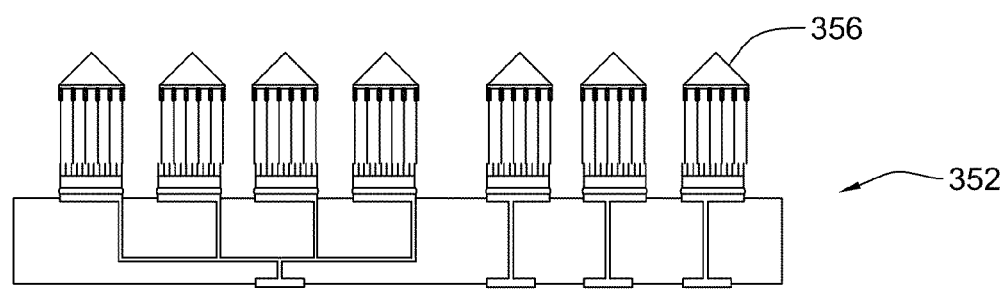
Figure 3L:
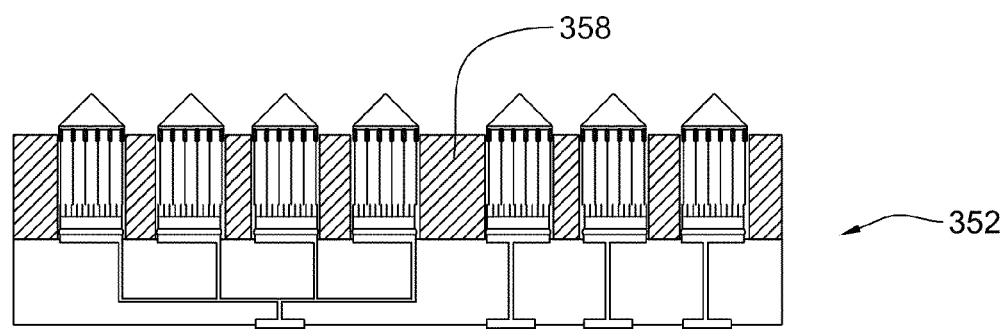
Figure 3M:
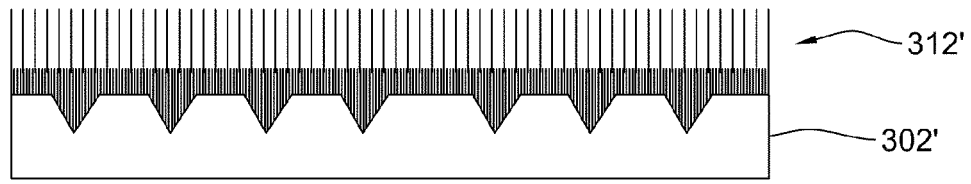
Figure 3N:
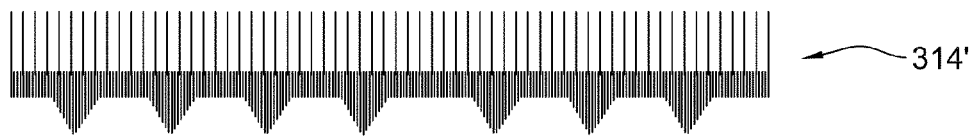
Figure 3O:
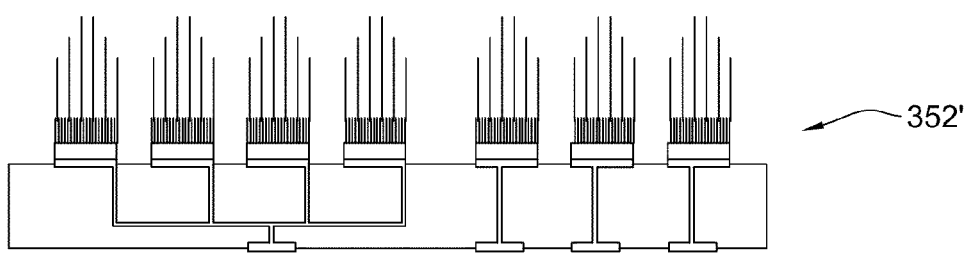

Alternative Fabrication Process Flow 3 for Fabricating an NT-Based Probe Card, with Reference to FIGS. 3a-l:

1. Substrate preparation.
   a. Typically an active surface is deposited onto the substrate after surface profile formation is complete. An active surface is typically SiO2, but may be any number of suitable materials, including but not limited to Al2O3, SiN, SiON, NiCr based or other metal alloys. This forms the chemically active layer onto which nucleation of the NT deposition is performed.
   b. The active layer thickness can be varied across the first substrate to selectively control the NT growth rate, thus selectively affecting the ultimate length of the NTs.
2. The substrate may be cleaned and placed into a Chemical Vapor Deposition (CVD) chamber, a precursor gas is flown into the chamber and the NTs 312 are grown uniformly across the surface of the active first substrate 302, as shown in FIG. 3a.
3. At this step (FIG. 3a) we are left with a full wafer-scale array of a uniform distribution layer of un-patterned NT pillars, forming a fabric 312 weakly attached to the first substrate.
4. If 3-dimensional arrangement of NTs is required, either on the upper or lower surface of the NT fabric, laser ablation is carried out to define the desired NT profile. Shapes such as a pyramid, conical or ziggurat shape are examples of potentially desirable profiles.
5. The bundles of NTs may be joined together at the upper surface defined by the confluence of the ends of the NT vertical pillars. Joining processes are defined above. Alternatively the NTs may be left as deposited.
6. In FIG. 3b, the substrate 302 supporting the NTs can be placed into a wet bath to remove the NT film or fabric 314 from the underlayer for example by wet etching the SiO2 in HF or other suitable etchant.
7. The thin NT 'fabric' 314 (FIG. 3c) may be rinsed and dried and surface pretreated (for example by plasma oxidation or surface laser ablation) on either side alternately or on both sides simultaneously. Two layers of carbon structures are visible in this figure (and in all other figures herein)—a base "matted" layer and a finer layer of nanotube growth. An option to all embodiments disclosed herein is the removal of either layer (for example, by etching) if the application warrants. This removal can leave either the "fine" nanotube layer for fine-grain connections, or the coarser layer, as required.
8. In FIG. 3d, the fabric is metallized 304 on either side alternately or on both sides simultaneously using processes including but not limited to:
   i. Evaporation or Sputtering of metal or metal alloy layers
   ii. Liquid chemical sensitization, followed by chemical activation
   iii. Electrolytic or electroless plating of metal or metal alloys
   iv. Molten metal capillary flow
9. The fabric can undergo transfer to a second substrate which will form the wafer-scale probe-card. This may be a wafer scale transfer process or sectionalized such that the sections are independent and 'tiled' onto the wafer to provide a full wafer surface 'tiled' coating, as discussed further below.
10. The probe card base may either be wafer scale (to create a wafer scale probe card) or scaled for smaller for single- or multi-field or single- or multi-die level probing. With reference to FIG. 3e, this second substrate 322 must first be patterned with a suitable electrical interconnect or signal routing pattern 324 designed for a specific IC wafer, such as previously described in the Background section. It is through these electrical interconnects that the ICs will be activated and tested. Electrical pad areas are patterned on the outermost surface which will be joined to the NT bundles, through which an electrical connection to the NT bundles will be formed. Fiducials at the edge of the second substrate provide an alignment reference pattern for subsequent processing steps. A final step in the preparation of the probe card base is to deposit a reflow-able metal solder eutectic 326 onto the electrical pads of the electrically active probe card base, which will be used to form the metallurgical bond to the NT fabric. This second substrate 322 becomes the probe card base, while the NTs form the vertically-compressive electrically conductive contacts between the probe card and the ICs. It is preferable to maintain the orientation of the deposited top and bottom surfaces of the NT fabric after transfer to the second substrate. This orientation selection allows the desired base compressive characteristic to be maintained.
11. This secondary substrate or probe card base (henceforth referred to as the probe card base) may be a ceramic wafer, silicon wafer, glass panel or printed circuit board combined with a series of patterned electrical conductors and insulation layers, provided to bring the power, ground and high frequency signals into the IC wafer. This probe card base may have a number of desirable integrated electrical functions such as a capacitor array or resistor array as needed.
12. The NT fabric described above is next joined to the probe card base. With reference to FIG. 3f (and as discussed above), the joining process may involve the creation of a metallurgical bond between the bases of the NT bundles and the electrical pads on the probe card base, using a compressive force 328 over fabric 314.
13. The stack is then reflowed at a temperature 330 above the melting point of the metal solder 326 previously deposited onto the electrical pads of the probe card base. Once the reflow step is complete, a metallurgical bond is formed between the NT fabric and the probe card base electrical pads. The NT fabric may be placed under a compressive load during the reflow process to assist in the creation of the metallurgical bond at the interface of the NT column and the metal pad of the probe card base.
14. At this stage (FIG. 3g), the NT fabric is strongly attached to the probe card base through metallurgical contact, forming the probe card 332.
15. In FIG. 3h, using the fiducials located at the edges of the probe card base for alignment, any ablation technique, e.g., laser ablation 334 can be used to ablate the NTs and metal layers to define electrically insulating regions surrounding the electrically conductive NT pillars. The result is to create NT bundles which are dimensionally aligned and patterned to match to the wafer I/O or Power/Ground pads. The NT pillars are patterned using the laser ablation technique to create probe bundles or probe arrays which match a semiconductor device or a full wafer of semiconductor devices.
16. The result (FIG. 3i) is a high aerial density, fine-pitch, highly compliant wafer-scale probe card 352 having an array of vertically-compressible, electrically conducting NT bundles metallurgically bonded to an electrically active probe card base.
17. As discussed above, and with reference to FIGS. 3j, 3k and 3l; the tips of the bundles can be metallized 354; formed into arbitrary shapes 356; and/or infiltrated with a strengthening material 358 (e.g., polymer or elastomer).
18. Low contact resistance can be achieved by forming the NT tips into a micro-indenter of a design which can effectively score or penetrate a surface. Such shape may be diamond-shaped, conical or any number of other abrasive profiles. Such shapes can also be useful for a range of other purposes. This can be achieved by first modifying the surface of a substrate to form a 3-dimensional mold pattern, which will define the finished 3-D profile of the NT array which is deposited onto this modified substrate. In FIG. 3m, an alternative, patterned substrate 302' is shown as a starting point for growing NTs 312'. "Negative" pyramid shapes are formed into the substrate 302' resulting in "positive" pyramid shapes formed during growth of the NT fabric 314' (FIG. 3n). This "positive" pyramid shape temporarily compresses flat as the NT fabric is compressed during further processing steps. When the compressive force is removed, the NTs expand and the "positive" pyramid shape recovers through the free top surface of the NT fabric. After the processing discussed above, a probe card 352' results, having the bundles profiled as a pyramid, as shown in FIG. 3o. These pyramid shaped tips on the NT probe bundles also provide a way to create an ablative probe tip, used to break through the surface oxide of a device under test's metal electrical contact pads. This structure also provides progressively increasing contact force, center to edge, as the bundle of redundant vertically-compressible nanotube contacts are compressed into the pad on the device under test. The profile of varying height, also allows a varying degree of contact between the bundle and the device under test depending on the amount of compressive force applied during test. This option is available for any of the process flows discussed herein.

Figure 4A:
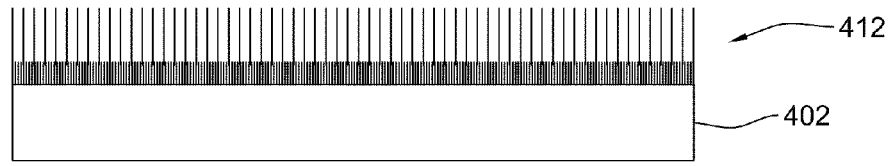
FIGS. 4a-n depict a process flow and associated structures for forming a probe card in accordance with a fourth embodiment of the present invention.
Figure 4B:
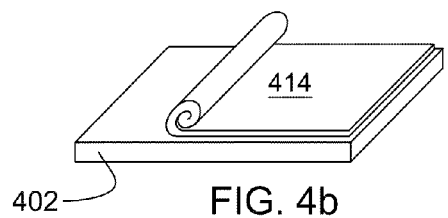
Figure 4C:
Figure 4D:
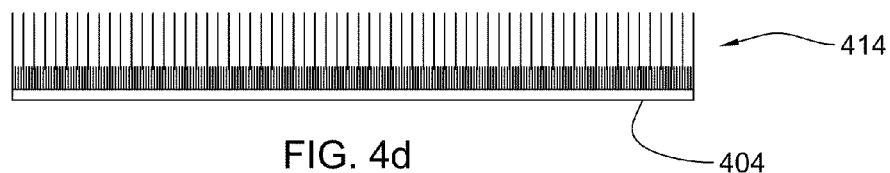
Figure 4E:
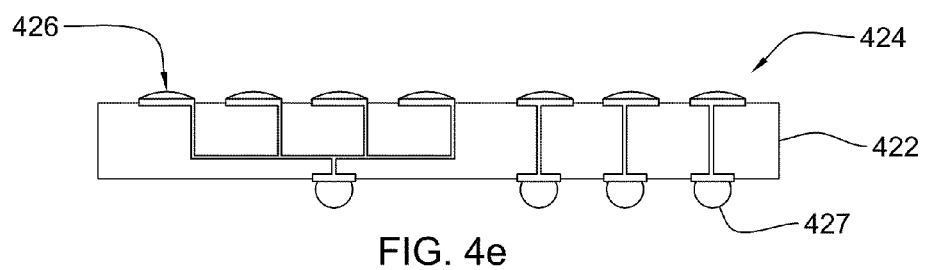
Figure 4F:
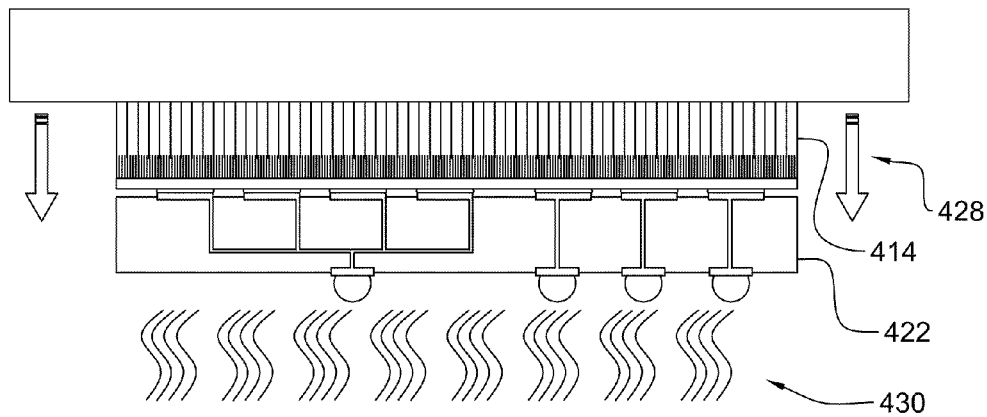
Figure 4G:
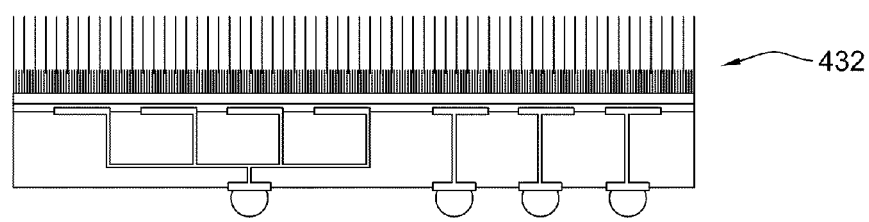
Figure 4H:
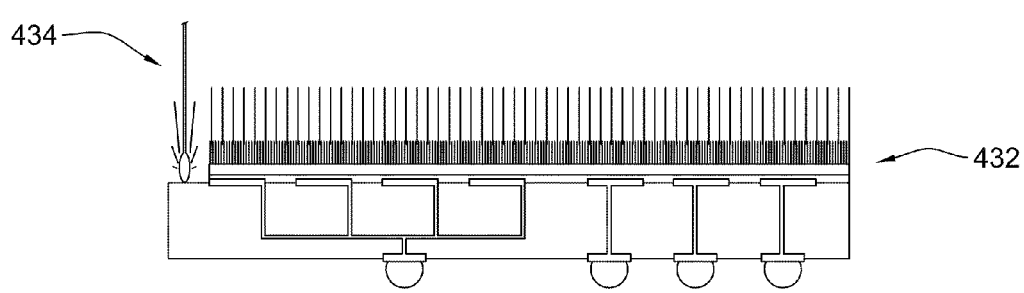
Figure 4I:
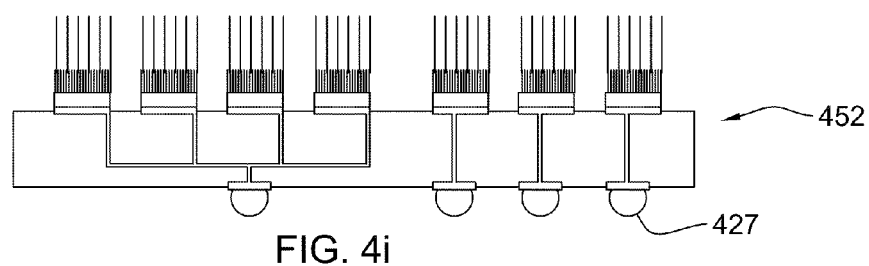
Figure 4J:
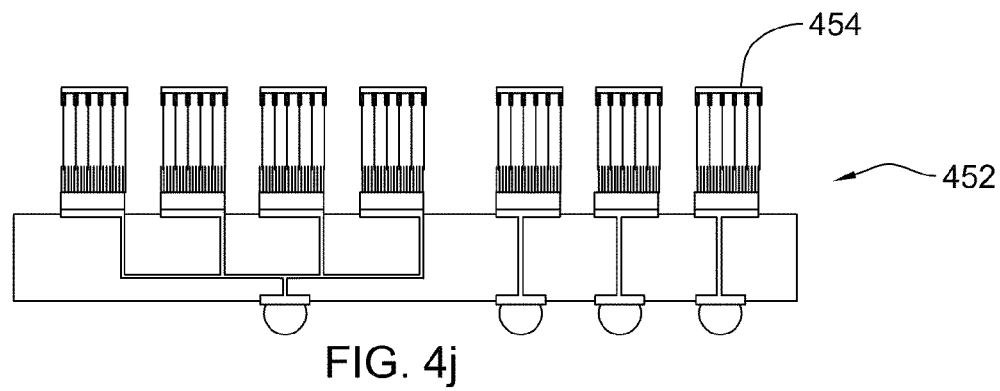
Figure 4K:
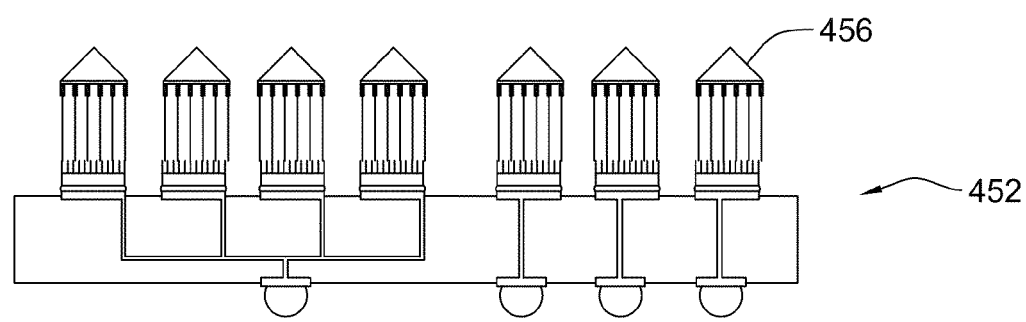
Figure 4L:
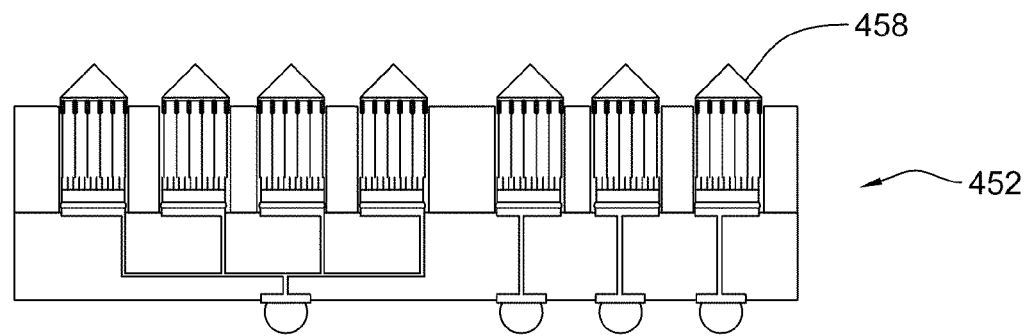
Figure 4M:
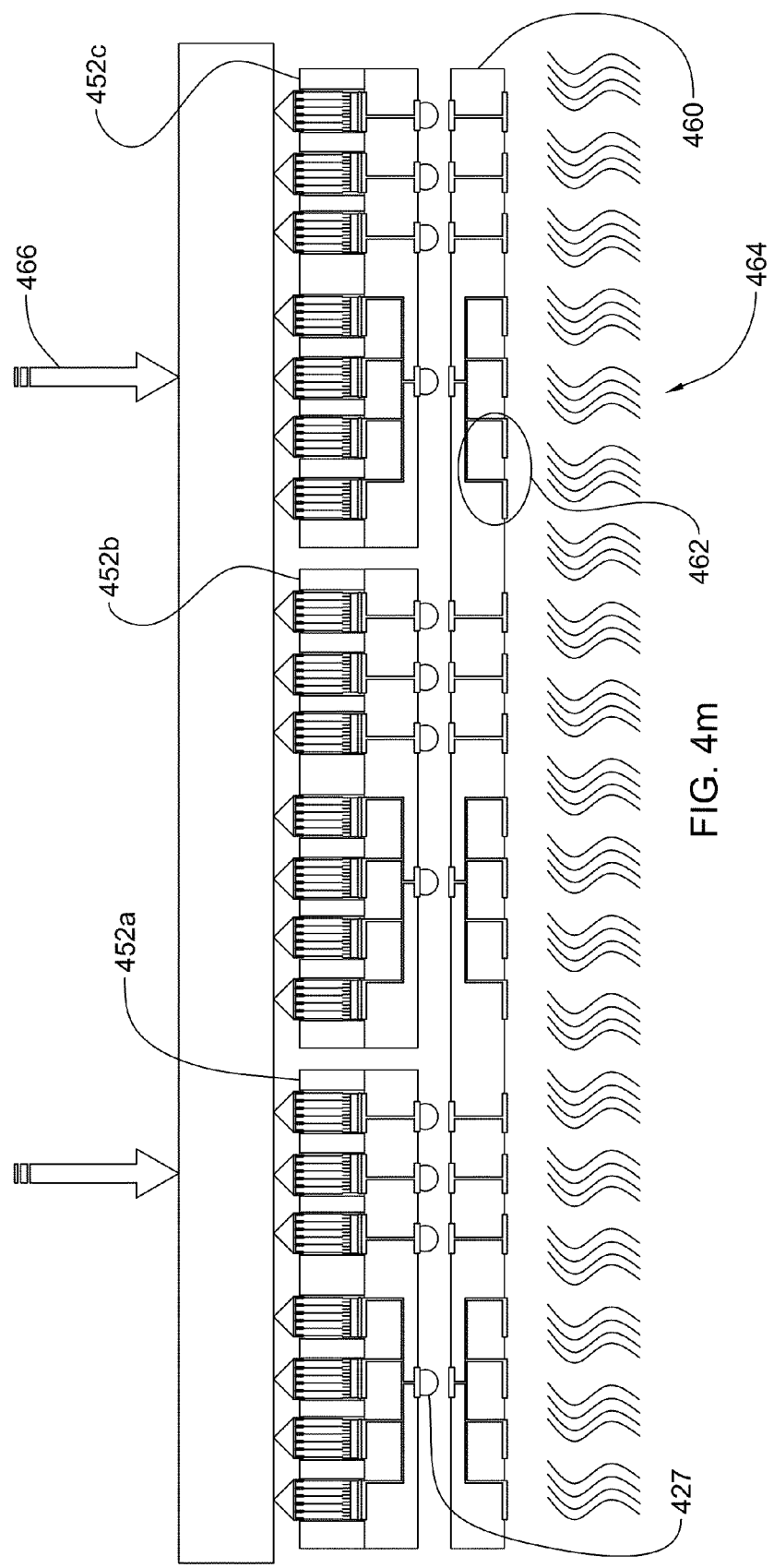
Figure 4N:
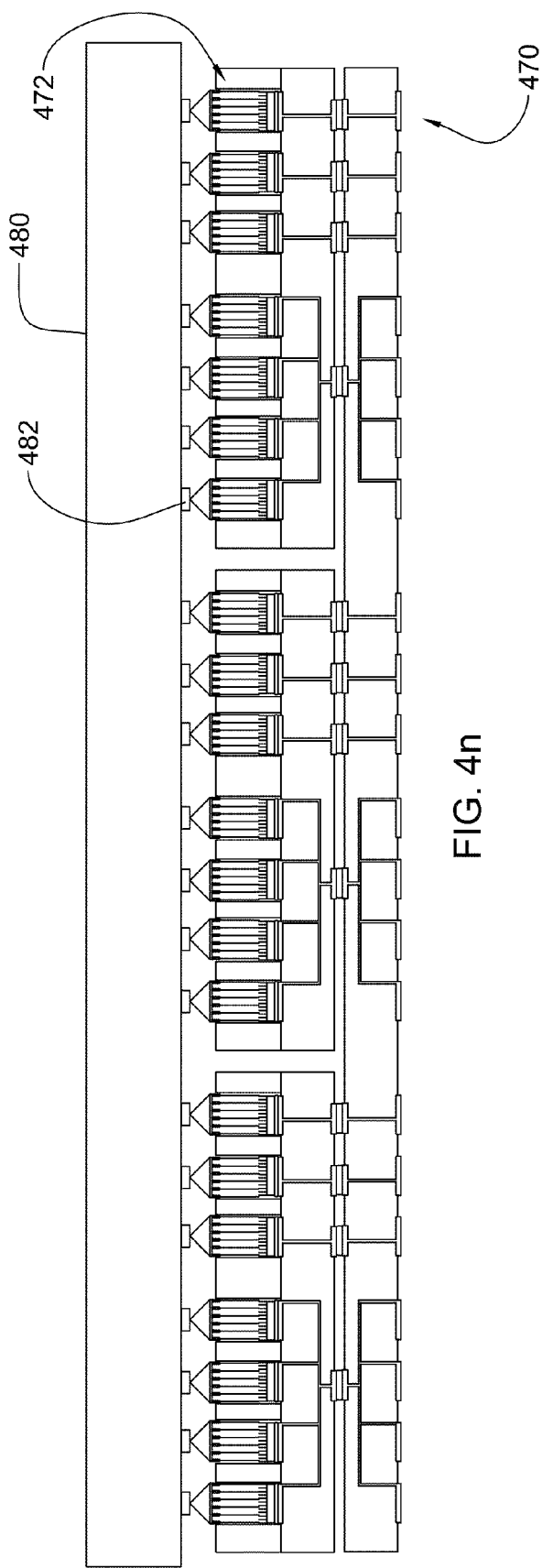

Alternative Fabrication Process Flow 4 for Fabricating an NT-Based Probe Card, with Reference to FIGS. 4a-n:

1. Substrate preparation.
   a. Typically an active surface is deposited onto the substrate after surface profile formation is complete. An active surface is typically SiO2, but may be any number of suitable materials, including but not limited to Al2O3, SiN, SiON, or certain metal alloys. This forms the chemically active layer onto which nucleation of the NT deposition is performed.
   b. The active layer thickness can be varied across the first substrate to selectively control the NT growth rate, thus selectively affecting the ultimate length of the NTs.
2. The substrate is cleaned and placed into a Chemical Vapor Deposition (CVD) chamber, a precursor gas is flown into the chamber and the NTs are grown uniformly across the surface of the active first substrate.
3. At this step (FIG. 4a) we are left with a full wafer-scale array of a uniform distribution layer of un-patterned NT pillars 412, forming a fabric weakly attached to the first substrate 402.
4. If 3-dimensional arrangement of NTs is required, laser ablation is carried out to define the desired NT profile, such as a pyramid, conical or ziggurat shape.
5. The bundles of NTs may be joined together at the upper surface defined by the confluence of the ends of the NT vertical pillars. Joining processes are defined above. Alternatively the NTs may be left as deposited.
6. In FIG. 4b, the wafer supporting the NTs is placed into a wet bath to remove the NT film or fabric 414 from the substrate 402 for example by wet etching the SiO2 in KOH.
7. The thin NT 'fabric' 414 (FIG. 4c) is dried and surface pretreated (for example by plasma oxidation) on either side alternately or on both sides simultaneously.
8. In FIG. 4d, the fabric 414 may be metallized 404 on either side alternately or on both sides simultaneously using processes including but not limited to:
   i. Evaporation or Sputtering of metal or metal alloy layers
   ii. Electrolytic or electroless plating of metal or metal alloys
   iii. Molten metal capillary flow
9. The fabric can undergo transfer to a second substrate which will form the wafer-scale probe-card. This may be a wafer scale transfer process or sectionalized such that the sections are independent and 'tiled' onto the wafer to provide a full wafer surface 'tiled' coating, as discussed further below.
10. The probe card base may either be wafer scale (to create a wafer scale probe card) or scaled for smaller for single- or multi-field or single- or multi-die level probing. In FIG. 4e, this second substrate must first be patterned with a suitable electrical interconnect or signal routing pattern 424 designed for a specific IC wafer, such as previously described in the Background section. It is through these electrical interconnects that the ICs will be activated and tested. Electrical pad areas are patterned on the outermost surface which will be joined to the NT bundles, through which an electrical connection to the NT bundles will be formed. Fiducials at the edge of the second substrate provide alignment for subsequent processing. A final step in the preparation of the probe card base is to deposit a reflow-able metal solder eutectic 426 onto the electrical pads, which will be used to form the metallurgical bond to the NT fabric. This second substrate becomes the probe card base, while the NTs form the vertically-compressive electrically conductive contacts between the probe card and the ICs. It is preferable to maintain the orientation of the deposited top and bottom surfaces of the NT fabric after transfer to the second substrate. This orientation selection allows the desired base compressive characteristic to be maintained. Solder bumps 427 can also be formed on the interconnect structure, to facilitate further connection to an underlying support layer (discussed further below).
11. This secondary substrate or probe card base (henceforth referred to as the probe card base) may be a ceramic wafer, silicon wafer, glass panel or printed circuit board combined with a series of patterned electrical conductors and insulation layers, provided to bring the power, ground and high frequency signals into the IC wafer. This probe card base may have a number of desirable integrated electrical functions such as a capacitor array or resistor array as needed.
12. The NT fabric described above is next joined to the probe card base. In this embodiment, the probe card base is either field or die level (single or multi). The joining process involves the creation of a metallurgical bond between the bases of the NT bundles and the electrical pads on the probe card base.
13. In FIG. 4f the fabric is subjected to a compressive force 428, and the stack is then reflowed at a temperature 430 above the melting point of the metal solder previously deposited onto the electrical pads of the probe card base. Once the reflow step is complete, a metallurgical bond is formed between the NT fabric and the probe card base electrical pads.
14. At this stage (FIG. 4g), the NT fabric is strongly attached to the probe card base through metallurgical contact, forming an integrated probe card 432.
15. In FIG. 4h, using the fiducials located at the edges of the probe card base for alignment, any ablation technique, e.g., laser ablation 434 can be used to ablate the NTs and metal layers to define electrically insulating regions surrounding the electrically conductive NT pillars. The result is to create NT bundles which are dimensionally aligned and patterned to match to the wafer I/O or Power/Ground pads. The NT pillars are patterned using the laser ablation technique to create probe bundles or probe arrays which match a semiconductor device or a full wafer of semiconductor devices.
16. In FIG. 4i, the result is a high aerial density, fine-pitch, highly compliant die or field scale probe card 452 having an array of vertically-compressible, electrically conducting NT bundles metallurgically bonded to an electrically active probe card base. This sub-component is henceforth referred to as a (NT probe tile). 17. As discussed above, and with reference to FIGS. 4*j*, 4*k* and 4*l*; the tips of the bundles can be metallized 454; formed into arbitrary shapes 456; and/or infiltrated with a strengthening material 458 (e.g., polymer or elastomer).

17. To support a larger scale, with reference to FIG. 4*m*, a further larger, third substrate 460 may first be patterned with a suitable electrical interconnect or signal routing pattern 462 designed for a specific IC wafer, such as previously described in the Background section. It is through these electrical interconnects that the ICs will be activated and tested. Electrical pads are patterned on the outermost surface which will be joined to the Nt-Probe Tile, providing a die or field scale probe card, which supports the NT bundles, through which an electrical connection to the NT bundles will be formed. The next step is the preparation of the probe card base is to deposit a reflow-able metal solder eutectic onto the electrical pads, which will be used to form the metallurgical bond to the NT-Probe Tile die or field level probe card. Multiple NT-Probe Tiles (452*a-c*), providing die or field level probe patterns are 'tiled' onto the larger probed card base, using the aforementioned solder bumps 427. This third substrate becomes the larger or wafer scale probe card base, while the NTs form the vertically-compressive electrically conductive contacts between the probe card and the ICs through the die or field level probe card.

18. This third substrate 460 or probe card base (henceforth referred to as the probe card base) may be a ceramic wafer, silicon wafer, glass panel or printed circuit board combined with a series of patterned electrical conductors and insulation layers, provided to bring the power, ground and high frequency signals into the IC wafer. This probe card base may have a number of desirable integrated electrical functions such as a capacitor array or resistor array as needed.

19. The tiled array of die 452*a-c* or field level probe cards are next joined to the probe card base. The joining process involves the creation of a metallurgical bond between the bases of the NT array supporting card and the electrical pads on the final probe card base.

20. A compressive force is aligned and applied 466 to the tiles 452*a-c*, and the stack is then reflowed at a temperature 464 above the melting point of the metal solder previously deposited onto the electrical pads of the probe card base. Once the reflow step is complete, a metallurgical bond is formed between the two probe card contacts.

21. At this stage (FIG. 4*n*), the NT fabric is strongly attached to the probe card base through metallurgical contact which in turn is attached to a larger scale probe card 470, which can be used to test a large scale wafer or other device under test 480, when the relevant contact pads 482 of the device are aligned with, and contact, the bundles 472.

Figure 8A:
FIGS. 8a-j depict a process flow and associated structures for forming a universal probe interface layer in accordance with another embodiment of the present invention.
Figure 8B:
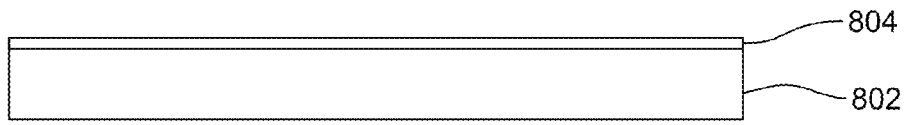
Figure 8C:
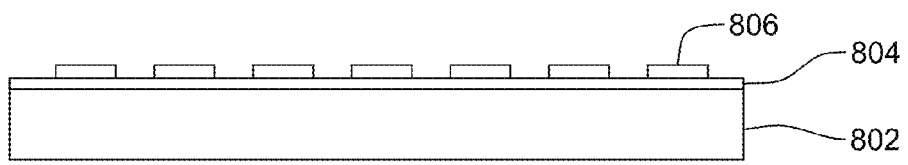
Figure 8D:
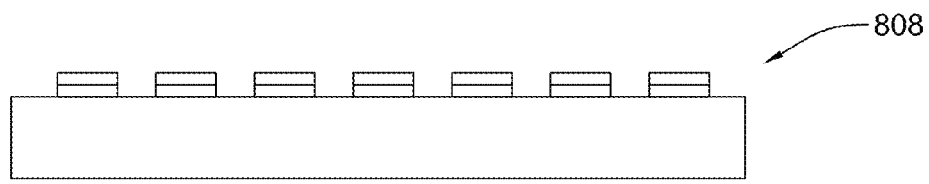
Figure 8E:
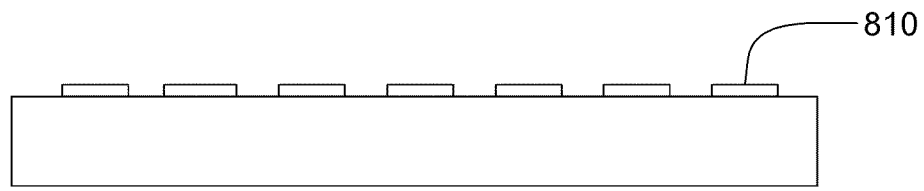
Figure 8F:
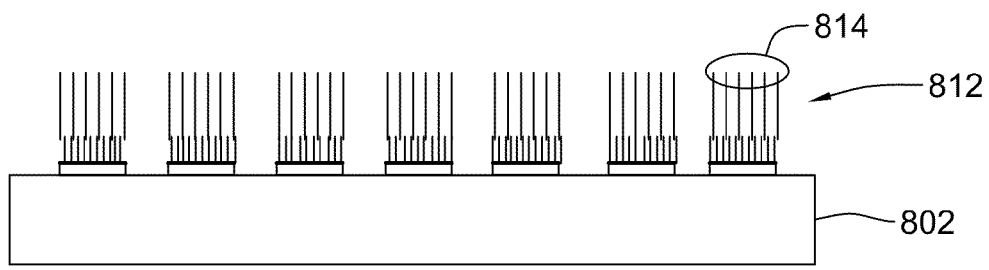
Figure 8G:
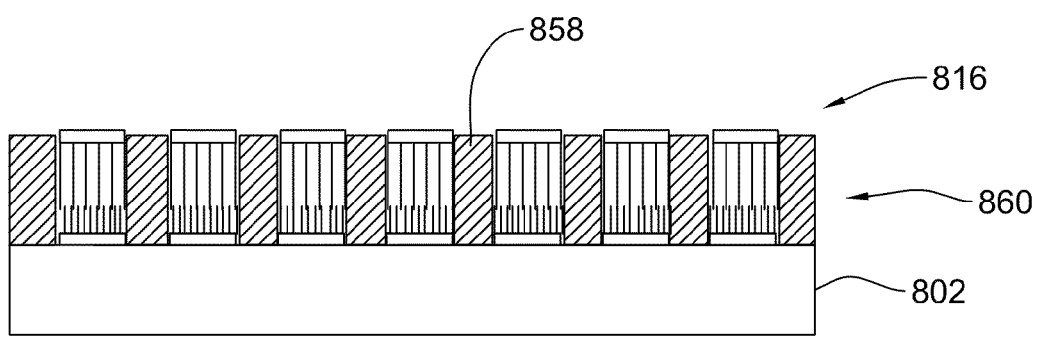

Example Fabrication Process Flow 5 for Fabricating a "Universal Probe Interface," with Reference to FIGS. 8*a-j*:

As discussed in the above process flows, additional radial insulation can be provided by adding an elastic insulator matrix around the vertically-conducting NT pillars or bundles. It is desirable to eliminate the need to pattern the NTs into localized (i.e., custom), isolated bundles in order to create isolated electrical contacts to the IC bond pads. A fully insulated, non-patterned version of the probe contact array could form the basis for a Universal Interface Probe (UPI), in which the probe contact layer is applied to an electrically custom-patterned probe card base which employs specific contact pads that align to a specific wafer IC bond pad pattern. The UPI would be used to provide a compliant electrical contact layer between the wafer and the probe card. This configuration would allow the probe card to be separated functionally into two sub-components: a more-costly but durable electrically patterned probe card base, and a less-costly but more fragile contact probe layer. Thus the UPI provides the function of a low cost, replaceable electrical contact fabric, which can be either permanently or temporarily joined to the electrically active probe card base to make a two-component probe card. This segregates the majority of the cost of the probe card into the durable electrically active probe card base sub-component while potentially using the UPI as a disposable, replaceable electrical contact film. An exemplary formation process is as follows:

1. Substrate preparation.
    a. If 3-dimensional arrangement of NTs is required, the substrate surface is patterned to form a negative profile of the desired NT profile, similar to the approach used to form a casting mold. This 3-dimensional profile might be an array of recessed valleys with pyramid or conical shapes or any other desired profile. Here, in FIG. 8*a*, substrate 802 is shown without profiling for simplicity.
    b. In FIG. 8*b*, typically an active surface 804 is deposited onto the substrate 802 after surface profile formation is complete. An active surface is typically SiO2, but can be any number of suitable materials, including but not limited to Al2O3, SiN, SiON. This forms the chemically active layer onto which nucleation of the NT deposition is performed.
    c. The active layer thickness can be varied across the first substrate to selectively control the NT growth rate, thus selectively affecting the ultimate length of the NTs.
2. In FIG. 8*c*, areas in which deposition of NTs is desired are masked over using an appropriate photoresist pattern 806.
3. In FIG. 8*d*, the active layer is etched away 808 in areas not masked by the photoresist, leaving a "universal" pattern of remaining active-area islands 810 where the NTs will be subsequently grown (FIG. 8*e*). Those skilled in the art will recognize that the above is a generalization of the steps necessary to form active areas 810, and that any other known lithographic techniques can be used, including the above-described technique of using a chemically active uniform layer, and masking areas to inhibit NT growth.
4. In FIG. 8*f*, the substrate can be cleaned and placed into a Chemical Vapor Deposition (CVD) chamber, a precursor gas is flown into the chamber and the NTs 812 are grown only in the areas in which the active-area film exists.
5. In the preferred embodiment of the process, the NTs uniquely grow in a "universal" pattern of bundles 814 of independent vertical pillars which are weakly attached to the SiO2 base films.
6. At this step we are left with a full wafer-scale array of a universal pattern 812 of bundles 814, which were grown into a 3-dimensional surface universal pattern previously formed into the surface of the substrate, and weakly attached to this first substrate 802.
7. In FIG. 8*g*, the bundles of NTs may be joined together 816 at the upper surface defined by the confluence of the ends of the NT vertical pillars. Joining processes include but are not limited to:
    i. Sputtering of metal or metal alloy layers
    ii. Electrolytic or electroless plating of metal or metal alloys
    iii. Molten metal capillary flow
    iv. Branching of the NTs to form structural-molecular links or chemical bonds between NTs
    v. Application of a polymer layer
    vi. Application of a tape or other temporary binder.

vii. Reliance on naturally occurring van der Waals attraction forces to hold the intimately layered NT bases together 8. Also with reference to FIG. 8g, an infiltration of a polymer/elastomer 858 between bundles can be employed to address fragmentation risk and add structural integrity. The polymer is preferably PI or PMMA. The resulting upper layer 860 now includes the metallized bundles surrounded by a supporting material.

Figure 8H:
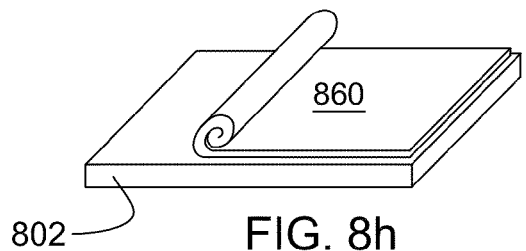
Figure 8I:
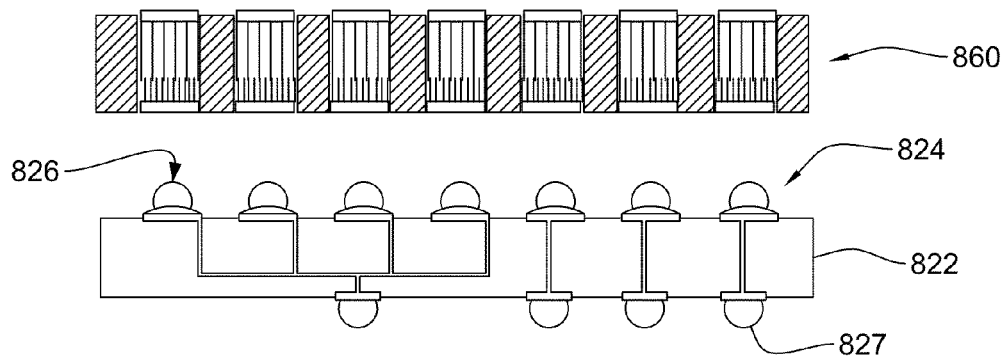

9. In FIG. 8h, the wafer supporting the NTs is placed into a wet bath to remove the NT film or fabric 860 from the substrate 802 for example by wet etching the SiO2 in KOH.

10. The thin NT 'fabric' 860 can be dried and surface pretreated (for example by plasma oxidation) on either side alternately or on both sides simultaneously.

Figure 8J:
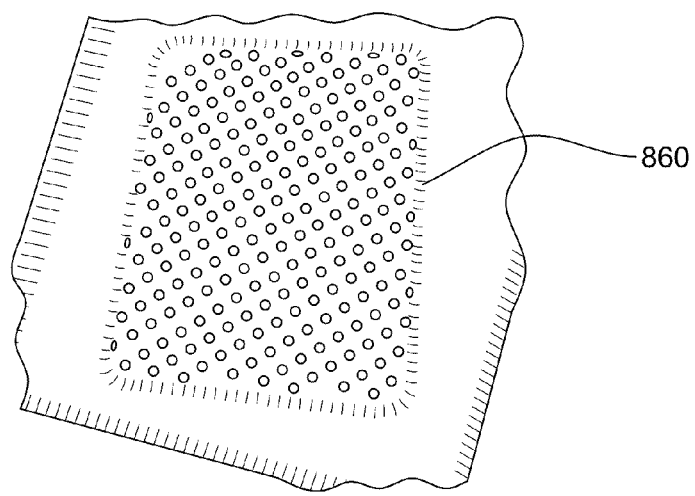

11. The resulting configuration (FIG. 8i) shows the probe card separated functionally into two sub-components: (1) the more-costly but durable electrically patterned probe card base 822 having lower contact bumps or pads 827 supporting connection of test apparatus (not shown) to a custom-patterned interconnect structure 824; and (2) a less-costly, disposable, but more fragile universal probe interface (UPI) layer 860, which serves as the compressible connection layer paced in between the upper bumps 826 on probe card base 822 and a sample under test to be aligned and placed above the layer (not shown). This layer may not be custom-patterned, and any bundles which do not contact bumps 826 simply go un-used. Thus the layer 860 provides the function of a low cost, replaceable electrical contact fabric, which can be either permanently or temporarily joined to the electrically active probe card base to make a two-component probe card. This segregates the majority of the cost of the probe card into the durable electrically active, custom patterned, probe card base 822 sub-component while potentially using the UPI layer as a disposable, replaceable electrical contact film 860. An exemplary, polymer-encapsulated UPI layer 860 is shown in the photograph of FIG. 8j—note the regular, non-custom pattern of bundles in the layer.

12. As discussed in the above process flows, the bases and/or tips of the bundles on layer 860 can be metallized and/or formed into arbitrary shapes.

Those skilled in the art will recognize that the layer 860 (with a custom or non-custom pattern of bundles) can alternatively be fixedly, permanently attached to the probe card base, following e.g., process flow steps such as those of FIG. 3f-3l or 4f-4i above (the bundles being pre-formed and therefore not requiring the disclosed laser ablation step disclosed in those steps).

Figure 9:
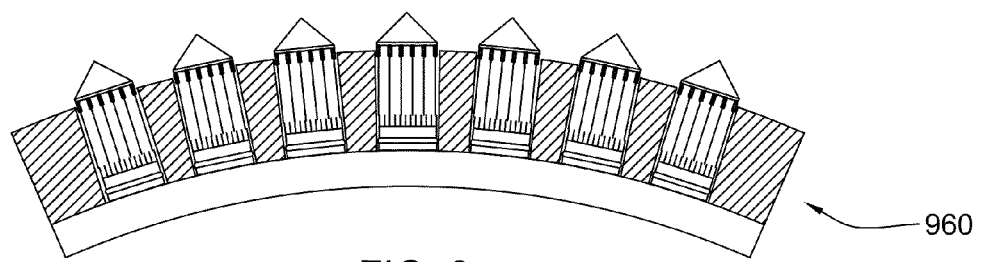
FIG. 9 depicts an embodiment of the present invention having a flexible substrate.

Flexible Substrate Embodiment:

In another embodiment of the invention, and with reference to FIG. 9, the vertically compressive probe elements can be attached to a flexible or inflatable substrate 960 through which variable compressive force can be applied to allow varying degrees of probe contact force across the area of an IC or across the area of a wafer. This allows varying range of compliance across the area of an IC or across the area of a wafer under test. In a related embodiment, the vertically compressive probe elements are attached to a segmented inflatable multi-chamber inflatable or expandable substrate through which incrementally variable compressive force can be applied to allow varying degrees of probe contact force or degree of compliance across the area of an IC or across the area of a wafer. And in another related embodiment, the probe card can be constructed with a combination of the vertically compressive, anisotropic-electrically conductive NT probe elements, the electrically active probe card base and the variable compressive multi-chamber inflatable or expandable substrate test head used with Automatic Test Equipment (ATE) for the purpose of electrical testing and or burn-in of IC wafers or electrical device panels.

Key Advantages of the Inventions Described Herein:

A probe card that enables cost-effective full wafer-scale or panel-scale parallel probing, often referred to as "Wafer Level Burn-In and Test". This is made possible through the following characteristics:

Highly compliant NT contact probes, capable of up to 90% compression without mechanical or electrical failure. The allows use of highly compliant NTs to form a probe card with compliance to accommodate variation in wafer flatness or probe length.

Low inductance: NTs with relatively short length can provide a high level of conformity to wafers which either have a high degree of topology or variation in wafer flatness, due to the high compliance/compression ratio of the NTs. This aspect makes NT contact probes particularly suitable for High Frequency (HF) applications.

Wafer flatness variation or surface topology can be compensated for through the unique features of the NT probe-card.

a. NTs can be deposited directly onto a compliant substrate to form a probe card in which compressive force can be applied through the substrate to the contact probes.

b. The compliant substrate can be constructed to form one wall of a pressure chamber, which would expand under pressure thus applying continuous static force through the compliant substrate to the contact probes and wafer pads.

c. Aerial force control can be achieved by segmenting the single pressure chamber into an array of individually inflatable pressure chambers which are used to individually actuate segregated areas of the probe card.

Can be applied in conjunction with compliant micro springs or MEMS devices to provide additional compliance or to provide contact redundancy.

Low total force per contact point resulting in minimal damage to low-k dielectric layers below the IC pad.

Low total force per contact results in minimal damage or indentation into the IC pad.

Extraordinarily small contact tip diameter enables thousands of NT pillars to fit within the topology of the metal grain structure of the IC bond pads. This increases the total electrical contact area available between the probe card and IC bond pad.

Extraordinarily high force per area (Kg/m^2), due to the nano-meter scale contact tip diameter, enabling high force concentration needed to break through a native oxide layer on an IC bond pad.

Highly Redundant contacts per IC pad (10,000's per pad), ensuring multiple low contact resistance contacts are being made to the IC Bond Pad.

The capability to create more than 4, electrically isolated contacts within a NT bundle, which can make contact to a single IC bond pad, which enables the formation of 4-point Kelvin contact structures which can be used for in-situ contact verification and contact resistance cancellation.

Ultra-fine pitch capability (as low as several microns) making through-wafer-interconnect (TWI) probing possible. This is an enabling feature for some 3-dimensional semiconductor wafer integration applications.

Anisotropic conduction ensures high electrical isolation between pads.

Laser ablation techniques can be used to selectively remove rows or columns of NTs from a field of NTs provides an additional method and level of electrical isolation between regions or bundles of NT probes.

Extremely low electrical resistance in the axial path, low self-capacitance as well as low mutual and self-inductance, making the NT probe card ideal for high frequency applications.

Can be combined with metal-abrasive matrix composites at the tip of the NT to minimize contract resistance to an IC Pad.
  a. The metal-abrasive matrix can be applied to the tip of the NT to provide a hard, wear resistant coating. The embedded abrasive matrix is used to break through metal-oxides, debris or other insulative films that may be present on the surface of a IC bond pad.
  b. The metal matrix composite material can be selectively deposited onto the tips of the NTs through electrolytic plating or other processes.

Alternatively, high hardness metals or metal alloys can be applied in a similar way to achieve low resistance contacts. These materials achieve consistently low contact resistance by avoiding the pick-up of foreign materials or contaminants from the IC pad through the selection of highly inert, platinum-group metals or alloys, such as PdCo, or electrically conductive, hard metal nitrides such as TiN, TaN, etc.

NTs provide high thermal conductivity in the axial direction, similar to its electrical characteristics—thus enabling the probe card to transfer heat into or out of the IC when in contact with the IC.

NTs are produced en-masse, using established Semiconductor Fabrication technologies, such as, but not limited to Chemical Vapor Deposition and photo-lithography, thus offer advantages in the economy of scale established in the industry. This is in contrast to the precise micro-machining, multi-step-electro-deposition or micro assembly techniques used in the fabrication of the prior art.

Inherent planarity of the NT tips, resulting from the controlled growth rate exhibited during the Chemical Vapor Deposition used in the fabrication of NTs.

Moreover, planarity can be further enhanced through a transfer process in which the array of fully grown NTs are joined at the NT tips to a second substrate and released from the first substrate at the base of the NTs. Since the NTs were originally grown from the planar substrate surface, the NTs will match the planarity of the first substrate.

The inventive concepts of this disclosure include, but are not limited to the following:
  An integrated Probe Card having Nano-Tubes (NT)s or similar classes of three-dimensional electrically conductive molecules, forming the electrically conductive vertically-compressive electrical probe contacts, combined with an electrically active, patterned probe card base.
  Temporary electrical contacts formed through the use of NanoTubes (NT)s, or similar classes of long-chain, three-dimensional electrically conductive molecules, such as, but not limited to: Carbon NanoTubes (CNT), Germanium NanoTubes (GeNT) or other.
  A structure and process to fabricate redundant vertically-compressible electrically-conductive contacts formed from microscopic vertically-compressible pillars using NTs or other similar 3-dimensional electrically conductive long-chain molecules.
  A structure and process to fabricate low inductance electrical interconnects using vertically-compressible electrically-conductive contacts, formed from microscopic vertically-compressible pillars using NTs or other similar 3-dimensional molecules.
  A structure and process in which an array of vertically-compressible, electrically conductive NT pillars is deposited using a chemical vapor deposition process resulting in highly uniform NT pillar height, resulting in uniform compression force and consequently, uniform electrical contact resistance.
  A structure and process to modify the electrical and mechanical properties of the tip of the vertically-compressible NT pillar through deposition of a combination other materials such as metals, metal-alloys or metal-ceramic-composites (MMC)s, onto the tips and/or bases of the vertically-compressible pillars.
  A structure and process in which vertically-compressible NT pillars combined with ablative materials such as metals, metal-alloys or metal-ceramic-composites (MMC)s, onto the tips and/or bases of the vertically-compressible pillars is applied as an electrically conductive probe designed to penetrate through a metallic surface oxide layer of an IC bond pad.
  A structure and process to modify the electrical or mechanical properties of the tip of the vertically-compressible NT pillar through chemical reaction with other materials such as organic or organo-metallic pre-cursors or catalysts.
  A structure and process to modify the morphological properties of the vertically-compressible NT pillar through chemical reaction with other materials such as but not limited to organic or organo-metallic pre-cursors or catalysts for the purpose of fabricating an electrical device probe card.
  A structure and process to modify specifically, the High Frequency (HF) electrical signal propagation characteristics of the NT probe contacts through modification of the NT deposition process or through chemical doping or secondary thin film deposition onto the NT pillars for the purpose of tuning the performance of an integrated probe card.
  A structure and process (ABOVE) to modify specifically, the High Frequency (HF) electrical signal propagation characteristics of the NT probe contacts through modification of the NT deposition process resulting in a change in density or the number of concentric walls comprising the NT pillars for the purpose of tuning the HF electrical signal performance of an integrated probe card.
  A structure and process to selectively tune the compressive spring rate of vertically-compressible NT pillars through chemical reaction with other materials such as but not limited to organic or organo-metallic pre-cursors or catalysts for the purpose of fabricating an electrical probe card.
  A structure and process to selectively tune the compressive spring rate of vertically-compressible NT pillars through chemical reaction with other materials such as but not limited to organic or organo-metallic pre-cursors or catalysts for the purpose of fabricating an electrical probe card.
  A structure and process to selectively tune the compressive spring rate and compression morphology of vertically-compressible NT pillars through process changes including, but not limited to: Concentration, Flow-Rate, Chemical Composition and Temperature of a gaseous-phase catalytically-activated chemical reaction. This chemical reaction can be adjusted through the in-situ introduction of other materials such as but not limited to organic or organo-metallic pre-cursors or catalysts.

A structure and process to selectively tune the compressive spring rate and compression morphology of vertically-compressible NT pillars through process variation in the first substrate including, but not limited to: Catalyst Concentration, Chemical Composition and Temperature of a Solid-Phase Catalytically-Activated chemical reaction. This chemical reaction can be adjusted through the in-situ introduction of other materials such as but not limited to organic or organo-metallic pre-cursors or catalysts.

A structure and process to modify the compressive spring rate of vertically-compressible NT pillars through cross-branching of the NT pillars during or after the initial deposition process.

A structure and process to modify the compressive spring rate of vertically-compressible NT pillars in which the cross-branching structures are inter-disposed within the NT pillar matrix.

A structure and process to modify the compressive spring rate of vertically-compressible NT pillars by loading the interstitial space between the NT pillars with other materials, such as but not limited to: polymers, glass fibers, or metals, during or after the initial deposition process.

A structure and process to fabricate or deposit a specifically defined pattern of NT probe contacts on a first substrate.

A structure and process of claim (ABOVE) to selectively etch a chemically-active substrate or catalytic layer on a substrate to form a defined pattern of active and non active locations on a substrate for the purpose of selective growth of NTs or other 3-dimensional, electrically conductive molecules on the substrate for the purpose of fabricating an specific pattern of NTs or other 3-dimensional, electrically conductive and compressive pillars for the purpose of fabricating an electrical probe card base or any other electrically active contact array. This chemically active base includes, but is not limited to a layer containing SiO2, Al2O3, SiN, SiON, FeO2 or any other materials capable of enabling or catalyzing the growth of 3-dimensional molecules.

A structure and process in which a surface of a first substrate is formed into a 3-dimensional profiled pattern used as a mold or mandrel into which the deposition of NT pillars results in the formation of a 3-dimensional profile of NT pillars once the pillars are transferred to a second substrate.

A structure and process in which an array of bundles of NT pillars are deposited onto a first substrate and joined to an electrically active second substrate, forming electrically conductive metallurgical bonds between the NTs and the second substrate.

A structure and process in which the NTs are weakly attached to the first substrate is during deposition of the NTs, allowing the array of deposited NT-bundles to be strongly bonded to a second substrate and subsequently separated from the first substrate, thus undergoing a transfer to the second substrate.

The structure of claim (ABOVE) in which the electrically active second substrate is a probe card base used in conjunction with Automatic Test Equipment (ATE) for the routing of electrical power, ground and signals into a IC wafer or a panel of electrical devices.

The structure of claim (ABOVE) in which the combination of the transferred NT bundle array and second substrate form a vertically compressive, electrically conductive IC-wafer probe card.

A structure and process to fabricate a 3-dimensional profile shape of individual, redundant vertically-compressible electrical contacts defined by the 3-dimensional outline of the tips of a bundle of contact pillars, wherein the pillars are deposited in progressively increasing length from edge to center of the NT bundle. The progression of increasing lengths can follow a 3-dimensional profile outline of any desired shape, such as a pyramid, ziggurat, conical, or other shape.

A structure and process to form a bundle or array of redundant vertically-compressible electrical contact pillars in such a way as to make progressively increasing number of contacts with an electrical bond pad, as the bundle of redundant vertically-compressible pillar contacts are compressed into the surface defined by the electrical device or IC bond pad.

A structure and process to form a bundle or array of redundant vertically-compressible electrical contact pillars in such a way as to make progressively increasing contact force, center to edge of the IC bond pad as the bundle of redundant vertically-compressible pillar contacts are compressed into the surface defined by the electrical device bond pad.

A structure and process to form an array of bundles of redundant vertically-compressible electrical contacts in such a way as to make each bundle make progressively increasing number of contacts with a multitude of electrical bond pads located within an electrical device, such as a IC wafer, as the array of bundles of redundant vertically-compressible pillar contacts are compressed into the surface defined by the electrical device.

A structure and process to join a bundle of vertically-compressible contacts together, into a single continuous contact surface or, as required, a single micro-indenter profile, having a unitized contact point supported by an array or bundle of fully individual and redundant vertically-compressible NT pillars. The micro indenter profile may be of any 3-dimensional shape, such as a pyramid, ziggurat, cone, ziggurat, blade or any other.

A structure and process in which vertically-compressible NT pillars combined with ablative materials such as metals, metal-alloys or metal-ceramic-composites (MMC)s, onto the tips and/or bases of the vertically-compressible pillars is applied as an electrically conductive probe designed to penetrate through a metallic surface oxide layer of an IC bond pad.

A structure and process to hold a bundle or array of bundles of vertically-compressible NT pillars together for the purpose of removing the NT array from a first substrate and transferring the bundle or array of NTs en-masse to a secondary substrate.

A method of forming a 4-point probe contact, which can be contained within a single IC pad, known in the industry as a Kelvin contact structure, used in the industry to measure and cancel the effects of contact resistance on non-redundant electrical contacts.

A structure and process to form a Kelvin contact structure within a single electrical contact pad.

A structure and process to form a Kelvin contact structure within a series of electrical contact pads, such as in the case of power and ground planes within an electrical device.

A structure and process to join vertically-compressible, electrically conductive NT pillars to form an anisotropic-electrically conductive flexible fabric, film or layer.

A structure of the claim (ABOVE) in which an insulative, elastic matrix is combined with an array of vertically-compressible NT pillars to join the NT pillar array together to form an anisotropic-electrically conductive film, layer or fabric.

A structure and process to form a two-part probe card in which an electrically active probe card base is combined with a replaceable, Universal Probe Interface (UPI) layer or film.

The structure of the claim (ABOVE) in which the UPI is a uniform array of NT vertical anisotropic-electrically conductive probe contact bundles confined within an elastomeric, insulative matrix defined at a standardized pitch and size forming a highly compressible, anisotropic-electrically conductive film or fabric which is capable of aligning to any IC wafer bond pad pattern in which the same pad pitch is employed.

The structure of claim (ABOVE) in which the UPI can be applied to a electrically active probe card base which is used to route the electrical ground, power and signals to the IC wafer bond pads through the UPI.

The probe card of claim (ABOVE) in which the probe card base and the UPI combine to form a probe card with a replaceable probe contact layer.

A modified structure of a probe card wherein the electrically conductive contact having a first and second compressive electrically conductive probe element, which form vertically-compressible spring contact elements.

The probe structure of claim (ABOVE) where the first compressive probe element is a micro-spring, wire-spring or MEMS device.

The probe card of claim (ABOVE), in which vertically compressive NT or other 3-dimensional molecule structures or probe elements are attached to the first compressive micro-spring structure, providing additional compliance range.

The probe card in which vertically compressive probe elements are attached to a flexible or inflatable substrate through which variable compressive force can be applied to allow varying degrees of probe contact force across the area of an IC or across the area of a wafer.

The probe card in which vertically compressive probe elements are attached to a flexible or inflatable or expandable substrate through which variable compressive force can be applied to allow varying range of compliance across the area of an IC or across the area of a wafer.

The probe card in which vertically compressive probe elements are attached to a segmented inflatable multi-chamber inflatable or expandable substrate through which incrementally variable compressive force can be applied to allow varying degrees of probe contact force or degree of compliance across the area of an IC or across the area of a wafer.

The probe card constructed with a combination of the vertically compressive, anisotropic-electrically conductive NT probe elements, the electrically active probe card base and the variable compressive multi-chamber inflatable or expandable substrate test head used in conjunction with Automatic Test Equipment (ATE) for the purpose of electrical testing and or burn-in of IC wafers or electrical device panels A structure and process sequence in which a NT fabric is grown on a first substrate then
a. released from the first substrate,
b. Surface prepared and metallized in preparation for subsequent metal solder bonding, and further metallization c. Metallurgically bonded to an electrically active second substrate, otherwise referred to as a probe card base,
  i. Metallurgical bond can be achieved through a solder mass-reflow or through a laser anneal process.
d. NT pillars are defined and electrically isolated from adjacent NT pillars through the use of laser ablation.
e. The electrically isolated NT pillars, formed through laser ablation, define electrical probes or probe arrays.
f. The NT pillars are arranged in bundles, groups or arrays matched to a semiconductor device I/O pad pattern in order to provide multiple redundant electrical contacts when used for the purpose of a semiconductor device or wafer probe card.
g. The individual NT probes and/or NT probe arrays tips are further metallized with a hard metal layer to provide a contact point capable of penetrating through a hard metal-oxide layer, commonly encountered on the surface of semiconductor device I/O pads
h. The integration of the NT probe arrays, to an electrically active probe card base, forming a device or wafer-scale probe card.

2. An alternative structure and process sequence in which the NT fabric is grown on a first substrate then
a. released from the first substrate,
b. Surface prepared and metallized in preparation for subsequent metal solder bonding, and further NT Tip metallization
c. Metallurgically bonded to the top-side of an electrically active second substrate, otherwise referred to as a probe tile.
  i. Metallurgical bond can be achieved through a solder mass-reflow or through a laser anneal process.
d. The probe tile, being an electrically active chip used for the purpose of routing densely packed NT probes (Fine Pitch) to a less densely packed (larger pitch) array of electrical contacts on the back-side of the probe tile.
e. NT pillars located on the top-surface of the probe-tile are defined and electrically isolated from adjacent NT pillars through the use of laser ablation, thus preparing an electrically active probe tile.
f. The electrically isolated NT pillars, formed through laser ablation, define electrical probes or probe arrays.
g. The NT pillars are arranged in bundles, groups or arrays matched to a semiconductor device I/O pad pattern in order to provide multiple redundant electrical contacts when used for the purpose forming a semiconductor device or wafer probe card.
h. The individual NT probes and/or NT probe arrays tips located on the probe tile are further metallized with a hard metal layer to provide a contact point capable of penetrating through a hard metal-oxide layer, commonly encountered on the surface of semiconductor device I/O pads
i. The probe-tiles, comprised of electrically active, fine-pitch NT probe arrays, electrically routed to large-pitch electrical pads on the back-side of the NT probe tile substrate are thus metallurgically bonded to a third electrically-active substrate to form a probe-card.
j. NT probe-tiles formed individually, allowing the fabrication of very large, wafer scale probe cards through the assembly of a multitude of smaller NT probe tiles onto a single, large probe card base.

k. NT probe tiles joined to the third, larger probe-card base through a solder reflow or other suitable metallurgical bond, forming a full-scale probe card.
l. The integration of the electrically active NT probe tiles to an electrically active probe card base, forming a device or wafer-scale probe card.
m. The complete full scale NT based probe card.
3. A second alternative structure and process sequence in which a NT fabric is grown directly on a metal substrate then
  a. Top Surface of NTs surface prepared and metallized in preparation for subsequent tip metallization
  b. NT-Substrate interface metallurgy is thermally annealed to provide a low resistance bond to the metal or semiconductor substrate.
  c. The metal substrate is etched down to a thickness that can later be laser ablated.
  d. The NT fabric, metallurgically bonded to the thinned metal substrate is metallurgically bonded to the topside of an electrically active second substrate, otherwise referred to as a probe card base.
    i. Metallurgical bond can be achieved through a solder mass-reflow or through a laser anneal process.
  e. NT pillars are defined and electrically isolated from adjacent NT pillars through the use of laser ablation.
  f. The electrically isolated NT pillars, formed through laser ablation, define electrical probes or probe arrays.
  g. The NT pillars are arranged in bundles, groups or arrays matched to a semiconductor device I/O pad pattern in order to provide multiple redundant electrical contacts when used for the purpose of a semiconductor device or wafer probe card.
  h. The individual NT probes and/or NT probe arrays tips are further metallized with a hard metal layer to provide a contact point capable of penetrating through a hard metal-oxide layer, commonly encountered on the surface of semiconductor device I/O pads
  i. The integration of the NT probe arrays, to an electrically active probe card base, forming a device or wafer-scale probe card.
4. A third alternative structure and process:
  a. Growing pre-patterned NT arrays on substrate
  b. Using polymer to infiltrate within/between bundles
  c. Removing layer from this substrate
  d. Metallizing base and contacting (ensure either: a. polymer temp OK to back and front metal/solder etc.; metallize with or without conformal front side metal coat, and with or without the tip forming/attach OR b. polymer removed after backside metal, then soldered (in case of no frontside metal);
  e. Ablation (e.g., laser) to remove the polymer and metal underneath and from between the die.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A probe card comprising:
a substrate comprising an electrically conductive pattern on a surface thereof;
bundles of joined nanotubes, each said bundle disposed on said conductive pattern and extending from said surface of said substrate; and
an elastic material disposed in spaces between said bundles,
wherein said elastic material is a distinct and different material than said nanotubes,
each of said bundles is part of an electrically conductive element coupled at one end to said conductive pattern and extending from said one end away from said surface to an opposite end.

2. The probe card of claim 1, wherein said nanotubes comprise carbon nanotubes.

3. The probe card of claim 1, wherein said nanotubes comprise germanium-nano-tubes.

4. The probe card of claim 1, wherein said elastic material comprises an elastomer.

5. The probe card of claim 1, wherein said elastic material is disposed on said surface of said substrate.

6. The probe card of claim 1, wherein said elastic material fills space between each of said bundles.

7. The probe card of claim 1, wherein said bundles are embedded in said elastic material.

8. The probe card of claim 1, wherein said nanotubes comprise single-walled-nano-tubes.

9. The probe card of claim 1, wherein said nanotubes comprise double-walled-nano-tubes.

10. The probe card of claim 1, wherein said spaces between said bundles in which said elastic material is disposed are external to each of said bundles.

11. A probe card comprising:
a substrate comprising an electrically conductive pattern on a surface thereof;
bundles of joined nanotubes, each said bundle disposed on said conductive pattern and extending from said surface of said substrate; and
an elastic material disposed in spaces between said bundles, wherein:
each of said bundles is part of an electrically conductive probe comprising a base end and a contact end,
said base end of said probe is coupled to said conductive pattern, and
said probe extends from said base end away from said surface of said substrate to said contact end.

12. The probe card of claim 11, wherein said contact end comprises metallization of a first end of said bundle.

13. The probe card of claim 12, wherein said first end of said bundle comprises a surface comprising a confluence of ends of said nanotubes of said bundle.

14. The probe card of claim 12, wherein said base end comprises metallization of a second end of said bundle opposite said first end.

15. The probe card of claim 14, wherein said second end of said bundle comprises a surface comprising a confluence of ends of said nanotubes of said bundle.

16. The probe card of claim 11, wherein said contact end comprises a cap-shaped tip coupled to a first end of said bundle.

17. The probe card of claim 11, wherein each of said bundles buckles under a compressive load on said contact end of said probe of which said bundle is a part.

18. The probe card of claim 11, wherein said probes are partially embedded in said elastic material with said contact ends of said probes extending from an outer surface of said elastic material.

19. The probe card of claim 11, wherein said elastic material is disposed on said surface of said substrate.

20. The probe card of claim 11, wherein said elastic material fills space between each of said bundles.

21. The probe card of claim 11, wherein said elastic material comprises an elastomer.

22. The probe card of claim 11, wherein said probe extends vertically from said base end away from said surface of said substrate to said contact end.

23. The probe card of claim 11 further comprising electrically conductive probes, wherein:
   each said probe comprises a base end coupled to said conductive pattern and a contact end disposed away from said substrate,
   each said probe is spaced apart from every other one of said probes,
   each said probe comprises one or more of said bundles, and said elastic material is disposed between said probes.

* * * * *